(12) United States Patent
Shao et al.

(10) Patent No.: US 11,404,123 B1
(45) Date of Patent: Aug. 2, 2022

(54) NON-VOLATILE MEMORY WITH MULTIPLE WELLS FOR WORD LINE SWITCH TRANSISTORS

(71) Applicant: SANDISK TECHNOLOGIES LLC, Addison, TX (US)

(72) Inventors: Shiqian Shao, Fremont, CA (US); Fumiaki Toyama, Cupertino, CA (US); Yuki Mizutani, Milpitas, CA (US); Mohan Dunga, Santa Clara, CA (US); Peter Rabkin, Cupertino, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/232,057

(22) Filed: Apr. 15, 2021

Related U.S. Application Data

(60) Provisional application No. 63/171,073, filed on Apr. 5, 2021.

(51) Int. Cl.
| | |
|---|---|
| *G11C 16/06* | (2006.01) |
| *G11C 16/08* | (2006.01) |
| *G11C 16/10* | (2006.01) |
| *G11C 16/04* | (2006.01) |

(52) U.S. Cl.
CPC .......... *G11C 16/08* (2013.01); *G11C 16/0483* (2013.01); *G11C 16/10* (2013.01)

(58) Field of Classification Search
CPC ...... G11C 16/08; G11C 16/0483; G11C 16/10
USPC .................................................. 365/185.17
See application file for complete search history.

(56) References Cited

U.S. PATENT DOCUMENTS

| | | |
|---|---|---|
| 8,537,595 B2 | 9/2013 | Toda |
| 8,917,554 B2 | 12/2014 | Toyama |
| 2003/0198101 A1 | 10/2003 | Pio |
| 2005/0265109 A1 | 12/2005 | Goda |
| 2007/0014152 A1 | 1/2007 | Shibata |

(Continued)

FOREIGN PATENT DOCUMENTS

| | | |
|---|---|---|
| DE | 102005004146 A1 | 6/2006 |
| JP | 2008091013 A | 4/2008 |

OTHER PUBLICATIONS

PCT International Search Report and Written Opinion dated May 11, 2022, PCT Patent Application No. PCT/US2022/012535.

(Continued)

*Primary Examiner* — Tha-O H Bui
(74) *Attorney, Agent, or Firm* — Vierra Magen Marcus LLP

(57) ABSTRACT

A non-volatile memory includes a non-volatile memory array comprising blocks of non-volatile memory cells, bit lines connected to the memory cells and word lines connected to the memory cells. Word line switch transistors connect the word lines to voltage sources. The word line switch transistors are positioned in triple wells. Multiple triple wells are utilized and the word line switch transistors are grouped into triple wells based on word line voltage ranges used during the programming process. In one embodiment, for a given block, the word line switch transistors connected to data word lines are positioned in a first triple well and the word line switch transistors connected to selection and dummy word lines are positioned in a second triple well. This structure allows the triple wells to be biased differently.

20 Claims, 20 Drawing Sheets

(56) References Cited

U.S. PATENT DOCUMENTS

| | | |
|---|---|---|
| 2008/0080244 A1 | 4/2008 | Lee et al. |
| 2010/0002522 A1 | 1/2010 | Park |
| 2010/0214842 A1* | 8/2010 | Honda .............. G11C 16/0483 |
| | | 365/189.11 |
| 2010/0322011 A1* | 12/2010 | Edahiro ............. G11C 11/5642 |
| | | 365/182 |
| 2011/0096602 A1* | 4/2011 | Kim ....................... G11C 16/34 |
| | | 365/185.11 |
| 2012/0069683 A1* | 3/2012 | Kamata .............. G11C 11/5642 |
| | | 365/185.25 |
| 2012/0155168 A1 | 6/2012 | Kim et al. |
| 2013/0107627 A1 | 5/2013 | Toyama et al. |
| 2014/0097481 A1 | 4/2014 | La Rosa et al. |

OTHER PUBLICATIONS

Santos, F., "Using fabrication options of CMOS process in favor of power applications", Research and Development Project Coordinator at Velsis, Dec. 26, 2019, 8 pgs.

Bourdele, K.K., et al., "The effect of triple well implant dose on performance of NMOS transistors," in IEEE Transactions on Electron Devices, vol. 49, No. 3, pp. 521-524, Mar. 2002, doi: 10.1109/16.987125.

\* cited by examiner

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

Figure 15

902 — applying one or more selection voltages to a first set of word line switch transistors connected to a first set of word lines that are connected to a first grouping of non-volatile memory cells, the first set of word line switch transistors comprises a first subset of word line switch transistors connected to a first subset of word lines for the block of non-volatile memory cells and a second subset of word line switch transistors connected to a second subset of word lines for the block of non-volatile memory cells, the first subset of word line switch transistors are positioned in a first triple well, the second subset of word line switch transistors are positioned in a second triple well, the one or more selection voltages turn on the first set of word line switch transistors

904 — applying one or more deselect voltages to a second set of word line switch transistors connected to a second set of word lines connected to second grouping of non-volatile memory cells, the one or more deselect voltages turn off the second set of word line switch transistors

906 — causing/biasing the first triple well to be at a higher voltage than the second triple well while applying the one or more selection voltages to the first set of word line switch transistors (e.g., biasing the first triple well to be at a first voltage and biasing the second triple well to be at a second voltage, the first voltage is higher than the second voltage)

908 — applying a first set of programming process voltages to the first subset of word line switch transistors while applying the one or more selection voltages to the first set of word line switch transistors in order to pass the first set of programming process voltages to the first subset of word lines, the first set of programming process voltages include a program voltage that is applied to a selected word line to program one or more memory cells connected to the selected word line

910 — applying a second set of programming process voltages to the second subset of word line switch transistors while applying the one or more selection voltages to the first set of word line switch transistors in order to pass the second set of programming process voltages to the second subset of word lines

US 11,404,123 B1

NON-VOLATILE MEMORY WITH MULTIPLE WELLS FOR WORD LINE SWITCH TRANSISTORS

PRIORITY CLAIM

This application claims priority to U.S. Provisional Application Ser. No. 63/171,073, filed on Apr. 5, 2021, titled "Architecture for Non-Volatile Memory." incorporated herein by reference in its entirety.

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a power source (e.g., a battery). One example of non-volatile memory is flash memory (e.g., NAND-type and NOR-type flash memory).

Programming data into non-volatile memory typically includes applying a program voltage to the control gate of the selected memory cells as a series of voltage pulses that increase in magnitude over time. In one possible approach, the magnitude of the pulses is increased with each successive pulse by a predetermined step size, e.g., 0.2-0.6 volts. In the periods between the program pulses, verify operations are carried out. That is, the programming level of each memory cell of a group of memory cell being programmed in parallel is read between successive programming pulses to determine whether it is equal to or greater than a verify level to which the respective memory cell is being programmed.

For some architectures, thousands of memory cells can be programmed or read at the same time. For example, with a NAND architecture the control gates of thousands of memory cells may be connected together by what is commonly referred to as a word line. Thus, by applying a program voltage to the word line, thousands of memory cells can be programmed at a time. Likewise, by applying a read voltage to the word line, thousands of memory cells can be read at a time.

A memory array may have many word lines, each used as a control line for a different set of memory cells. For some architectures, programming or reading is performed on one word line at a time. Typically, this is referred to as the selected word line. Thus, a programming voltage may be applied to the selected word line, and at that same time another voltage that does not program memory cells is applied to unselected word lines.

One technique for applying the necessary voltages to the word lines is through a word line switch transistor that is connected to each word line. For some techniques, in order to turn on the word line switch transistor to transfer the program voltage to the word line, the gate of the word line switch transistor needs to be biased to at least the program voltage plus the word line switch transistor's threshold voltage. Program voltages may be quite large, thus the needed gate voltage is even larger. To accommodate the large gate voltage, the word line switch transistor must be made larger than would be needed for a smaller gate voltage. As memory arrays have become larger, with more word lines and more memory cells, more word line switch transistors are needed. Therefore, word line switch transistors are occupying more space on the semiconductor die, which will require a bigger die or prevent inclusion of circuits that perform other functions. Therefore, there is a need to reduce the space used for word line switch transistors.

BRIEF DESCRIPTION OF THE DRAWINGS

Like-numbered elements refer to common components in the different figures.

FIG. 15 is a flow chart describing one embodiment of a process for programming non-volatile memory.

DETAILED DESCRIPTION

Technology is described herein for reducing the size of the word line switch transistors, thereby reducing the space on the semiconductor die used for the word line switch transistors. Word line switch transistors are typically positioned in triple wells. To reduce the size of the word line switch transistors, it is proposed to use multiple triple wells and group the word line switch transistors into triple wells based on word line voltage ranges used during the programming process. In one embodiment, for a given block, the word line switch transistors connected to data word lines are positioned in a first triple well and the word line switch transistors connected to selection and dummy word lines are positioned in a second triple well. This structure allows the triple wells to be biased differently such that the voltage difference across the word line switch transistors is reduced. Since the word line switch transistors need only accommodate a smaller voltage than prior memory systems, the word line switch transistors can be made smaller, thereby, reducing the area on the semiconductor die used for the word line switch transistors.

Figure 1:
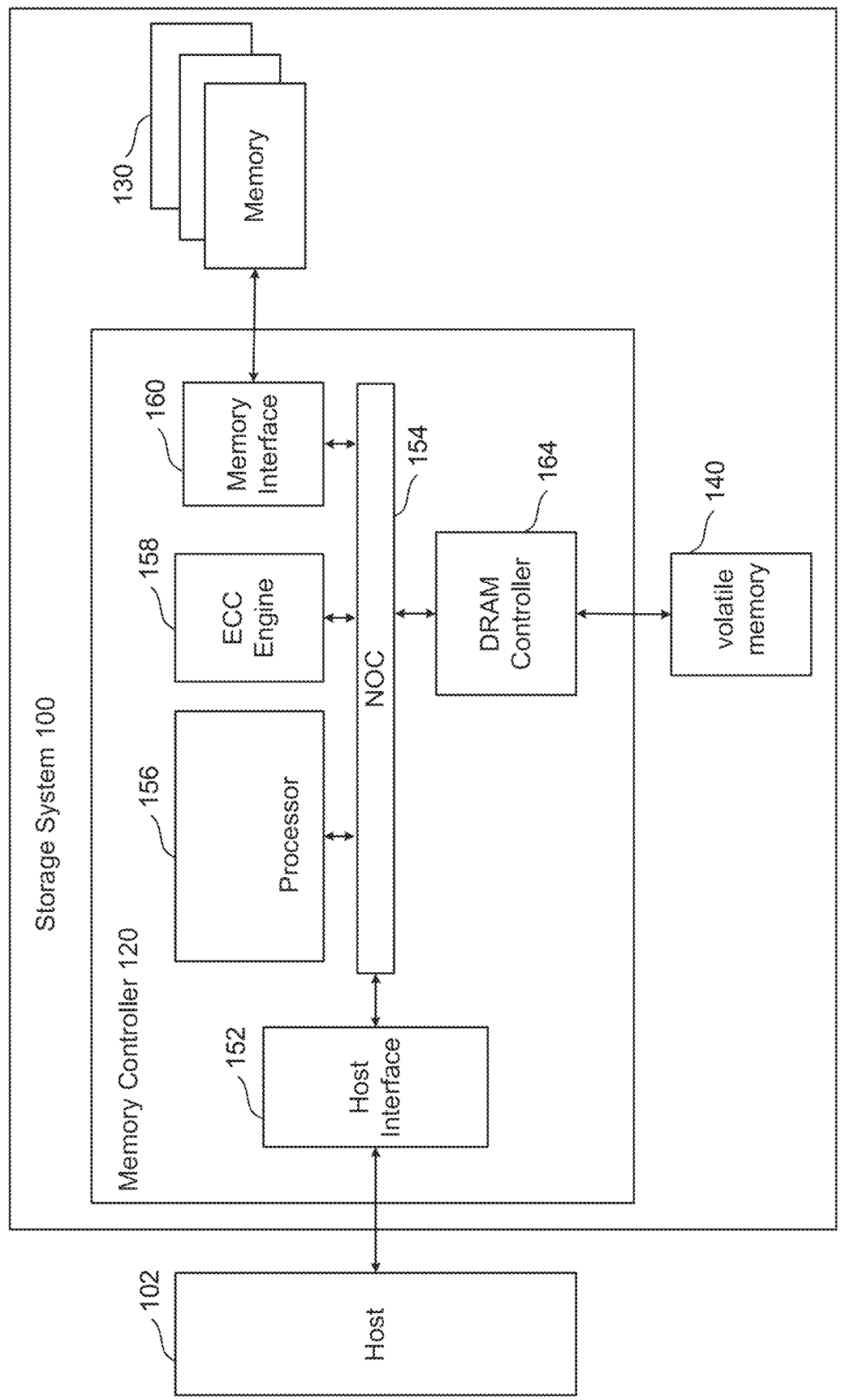
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
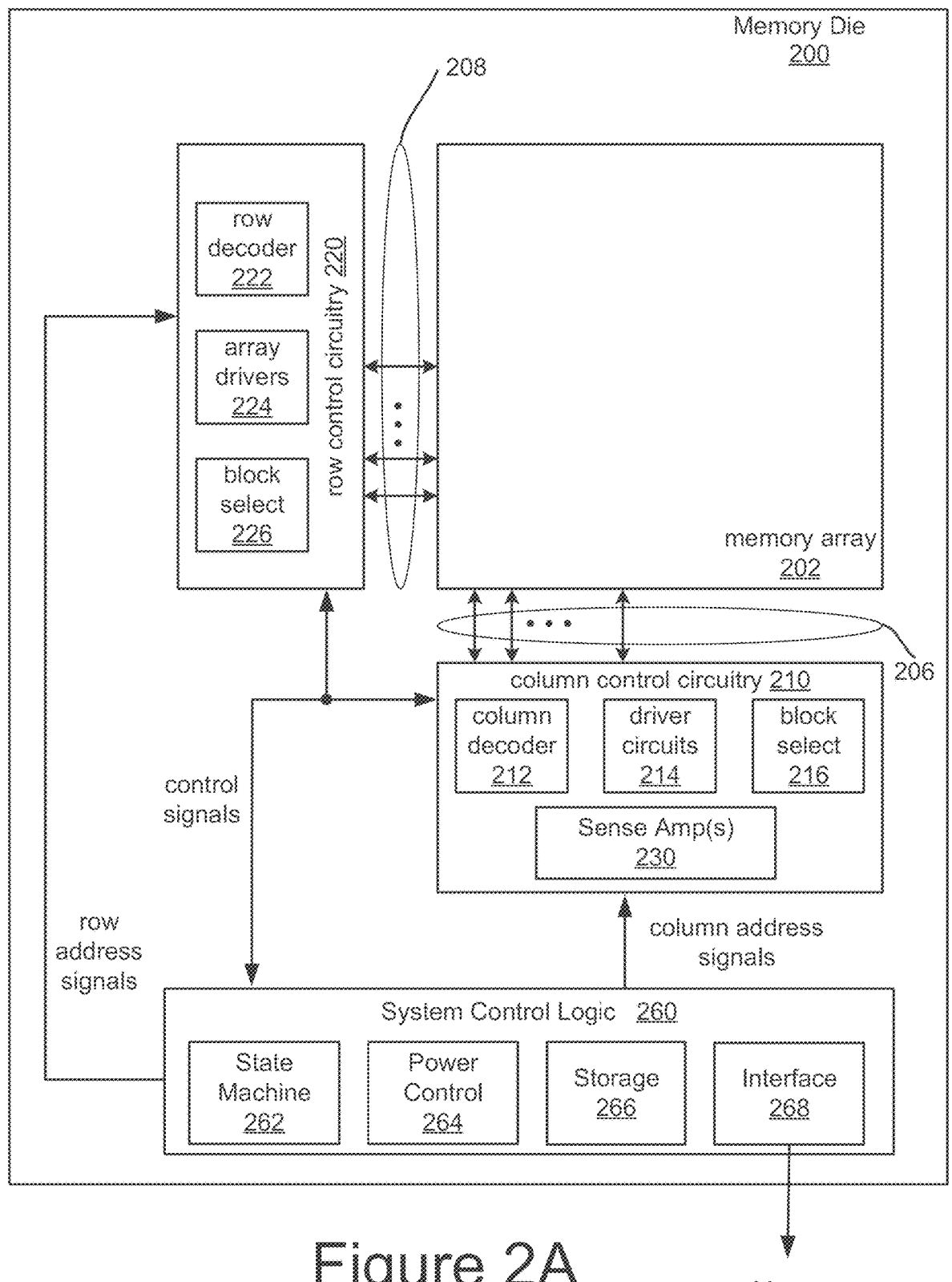
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprises non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 206, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 262 can also include a power control module 264 that controls the power and voltages supplied to the rows and columns of the memory structure 202 during memory operations and may include charge pumps and regulator circuit for creating regulating voltages. System control logic 262 includes storage 366 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 360, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 302 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe-Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 302 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
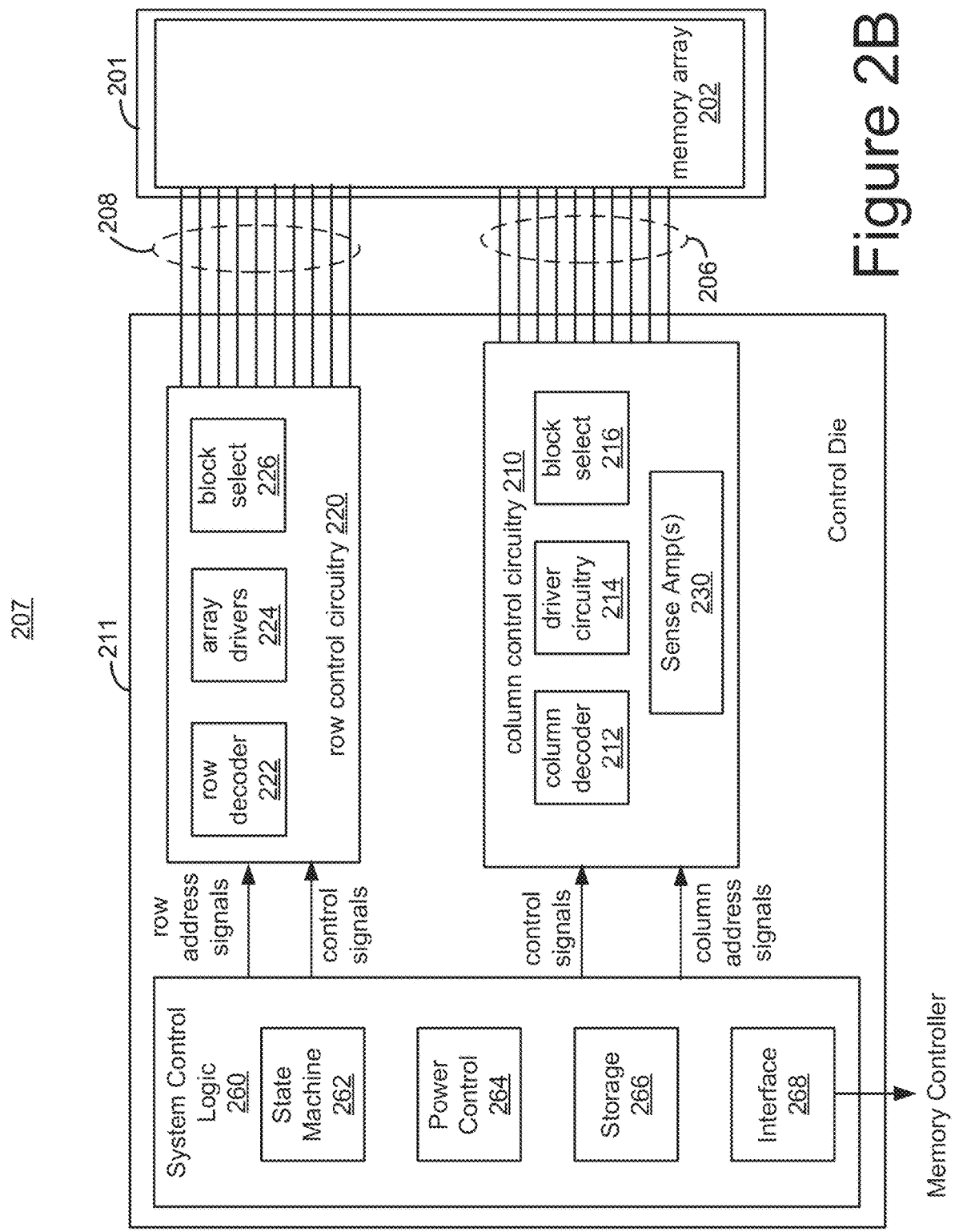
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 307 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 311 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory 2 die 201 may reduce the number of steps needed to fabricate such a die, adding such circuits to a die such as control die 311 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 306, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrase "one or more control circuits" can include any one of or any combination of memory controller 120, state machine 262, all or a portion of system control logic 260, all or a portion of row contrail circuitry 200, all or a portion of column control circuitry 210, a microcontroller, a microprocessor, and/or other similar functioned circuits. The one or more control circuits can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 2C:
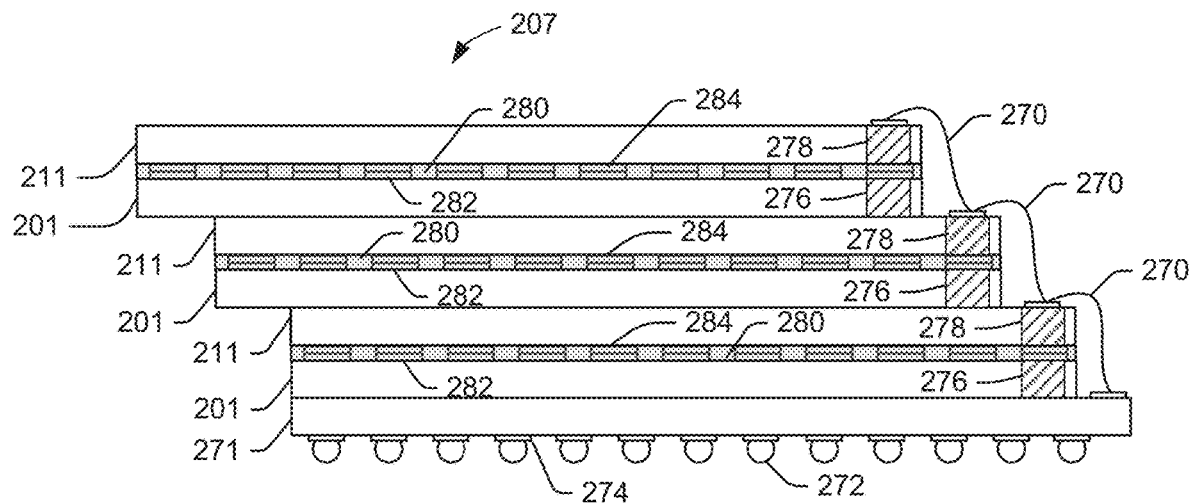
FIGS. 2C and 2D depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 2C depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 2C).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 2D:
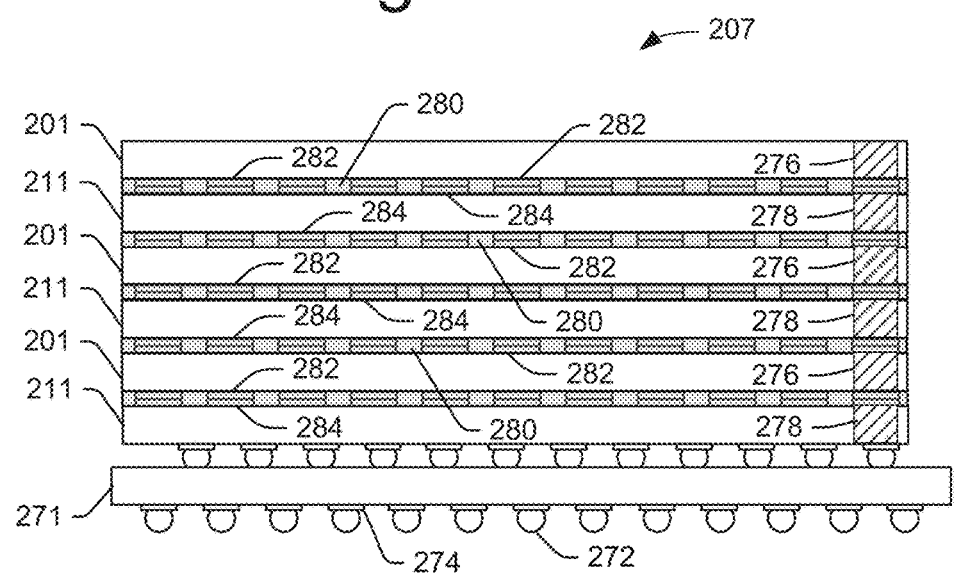

FIG. 2D depicts a side view of another embodiment of an integrated memory assembly 207 stacked on a substrate 271. The integrated memory assembly 206 of FIG. 2D has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 2C, the integrated memory assembly 207 in FIG. 2D does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 3:
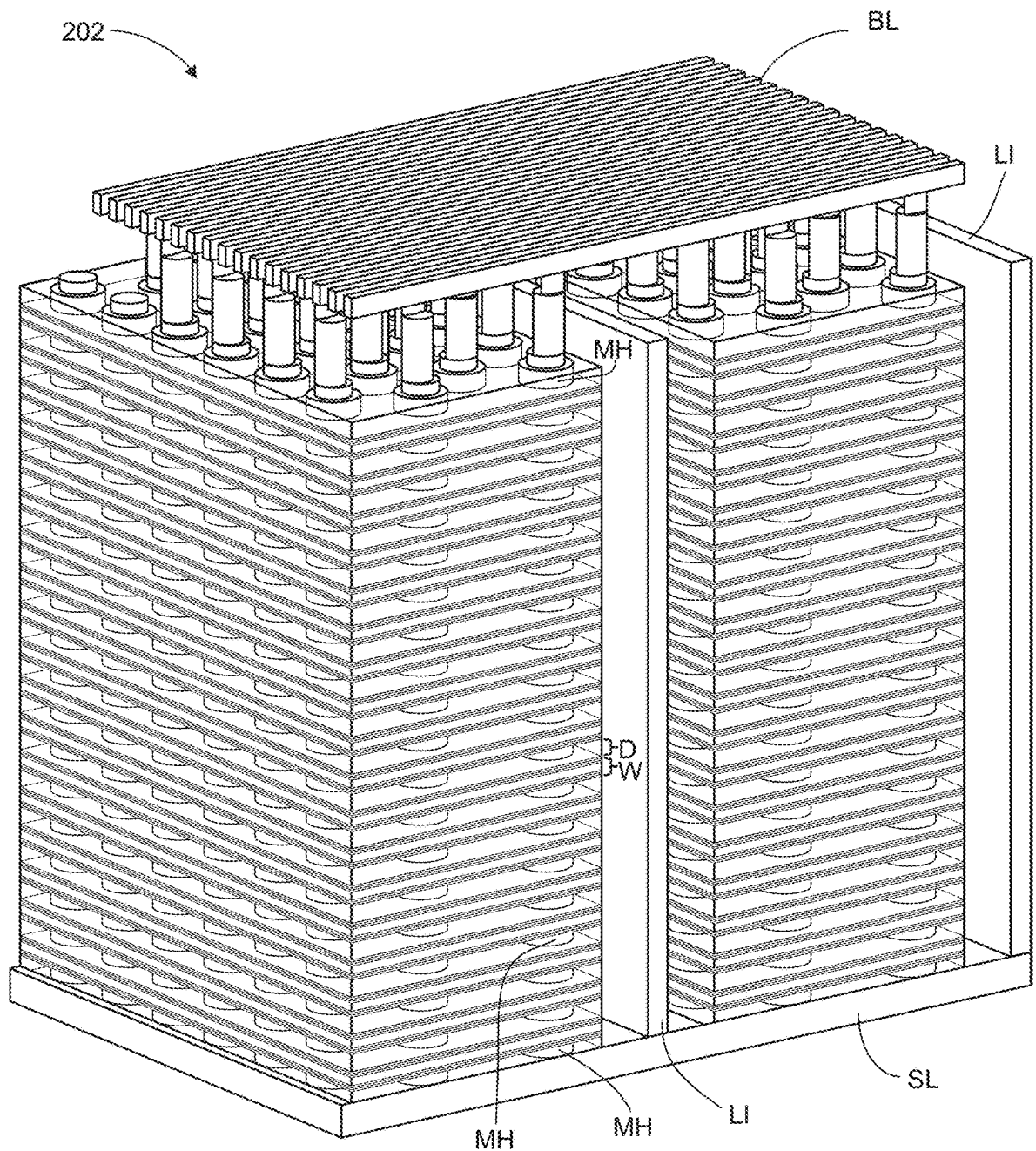
FIG. 3 is a perspective view of a portion of one embodiment of a monolithic three dimensional memory structure.

FIG. 3 is a perspective view of a portion of one example embodiment of a monolithic three dimensional memory array/structure that can comprise memory structure 202, which includes a plurality non-volatile memory cells arranged as vertical NAND strings. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. More or less than 108-300 layers can also be used. As will be explained below, the alternating dielectric layers and conductive layers are divided into four or more regions (e.g., sub-blocks) by local interconnects LI. FIG. 3 shows two fingers and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below with respect to FIG. 4A-4E.

Figure 4A:
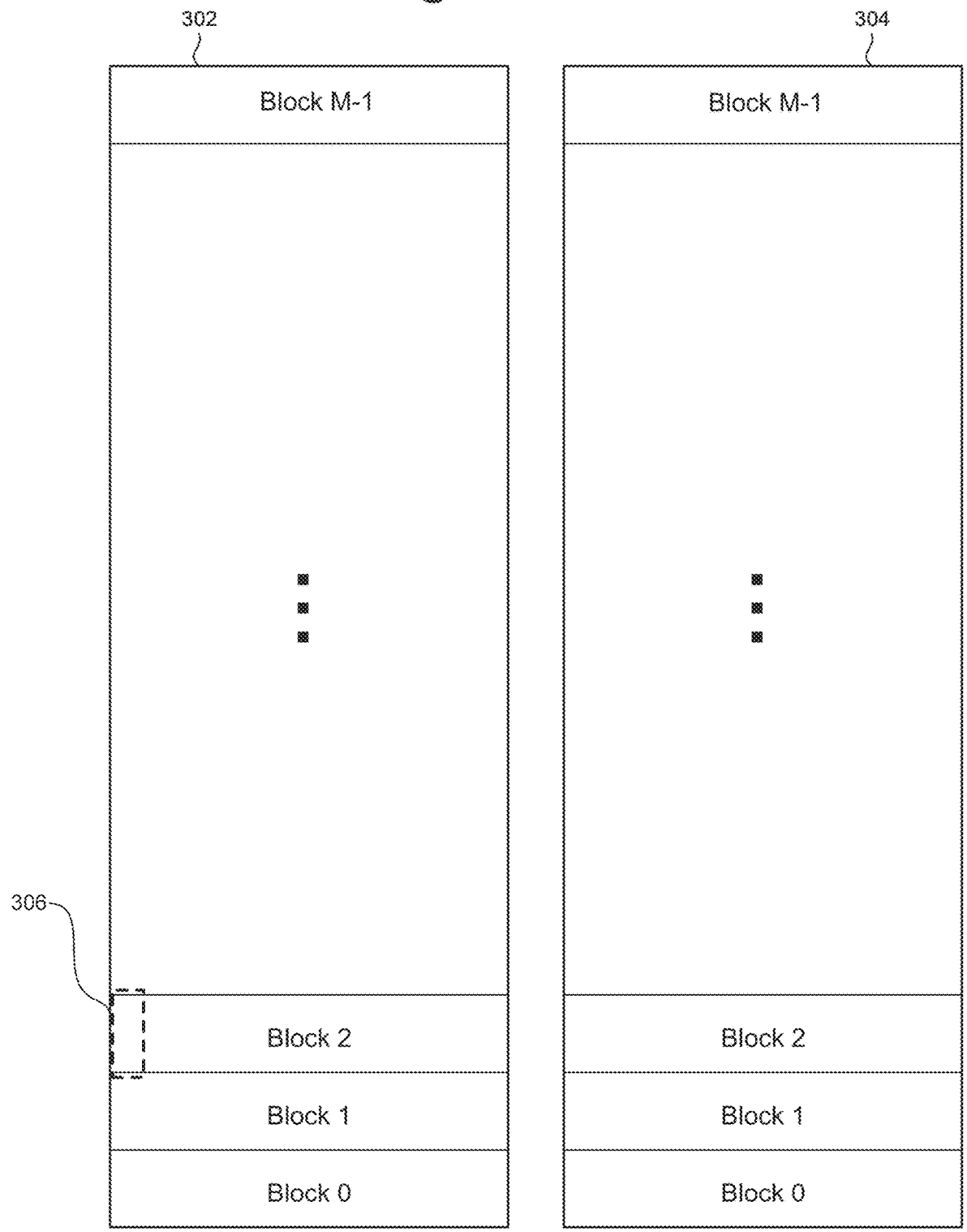
FIG. 4A is a block diagram of a memory structure having two planes.

FIG. 4A is a block diagram explaining one example organization of memory structure 326, which is divided into two planes 302 and 304. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 326 to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 302/304, more or less than two planes can be implemented. Ion some embodiments, memory structure 202 includes four planes.

Figure 4B:
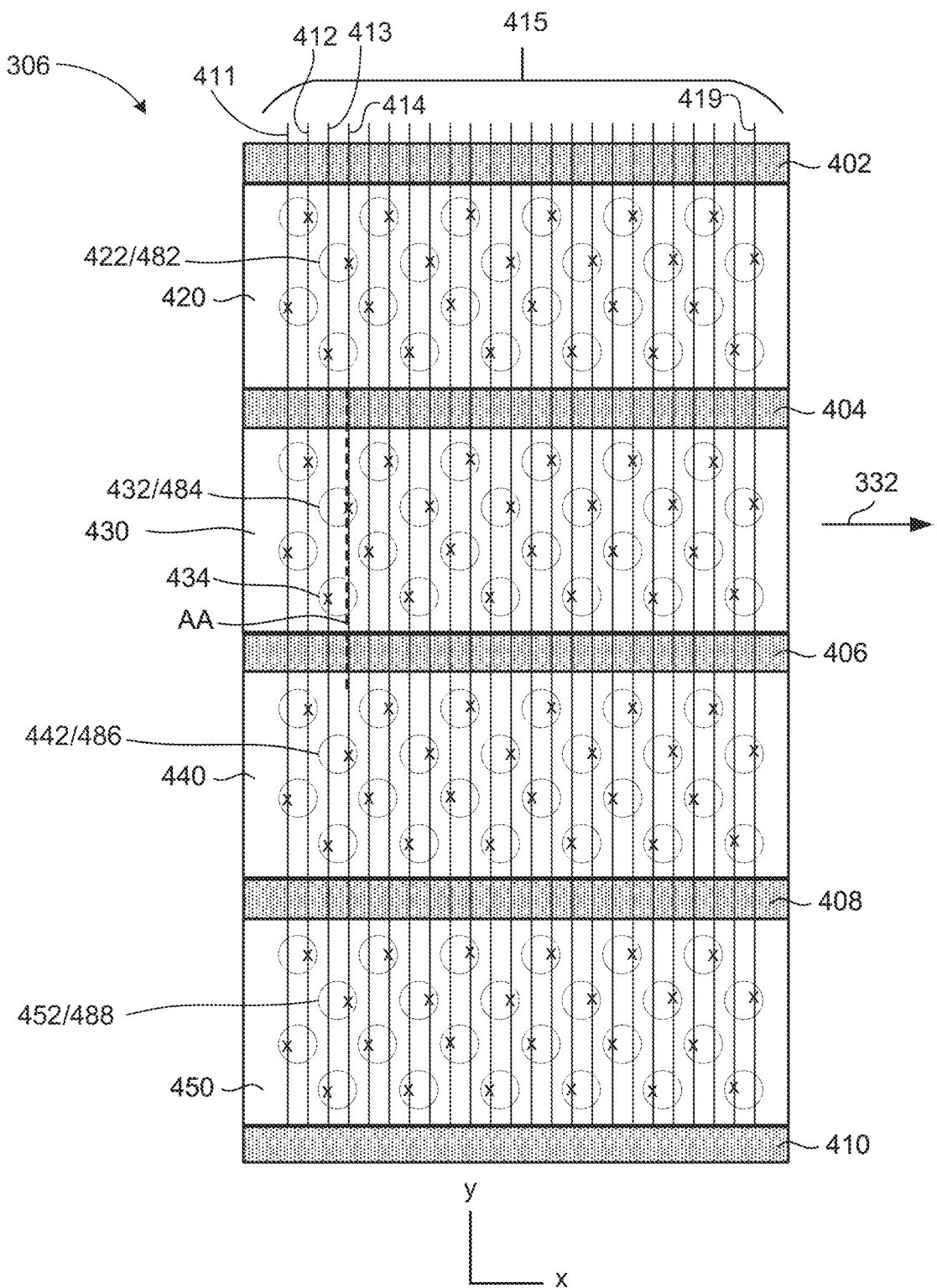
FIG. 4B depicts a top view of a portion of a block of memory cells.

FIGS. 4B-4E depict an example three dimensional ("3D") NAND structure that corresponds to the structure of FIG. 3 and can be used to implement memory structure 202 of FIGS. 2A and 2B. FIG. 4B is a block diagram depicting a top view of a portion of one block from memory structure 326. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
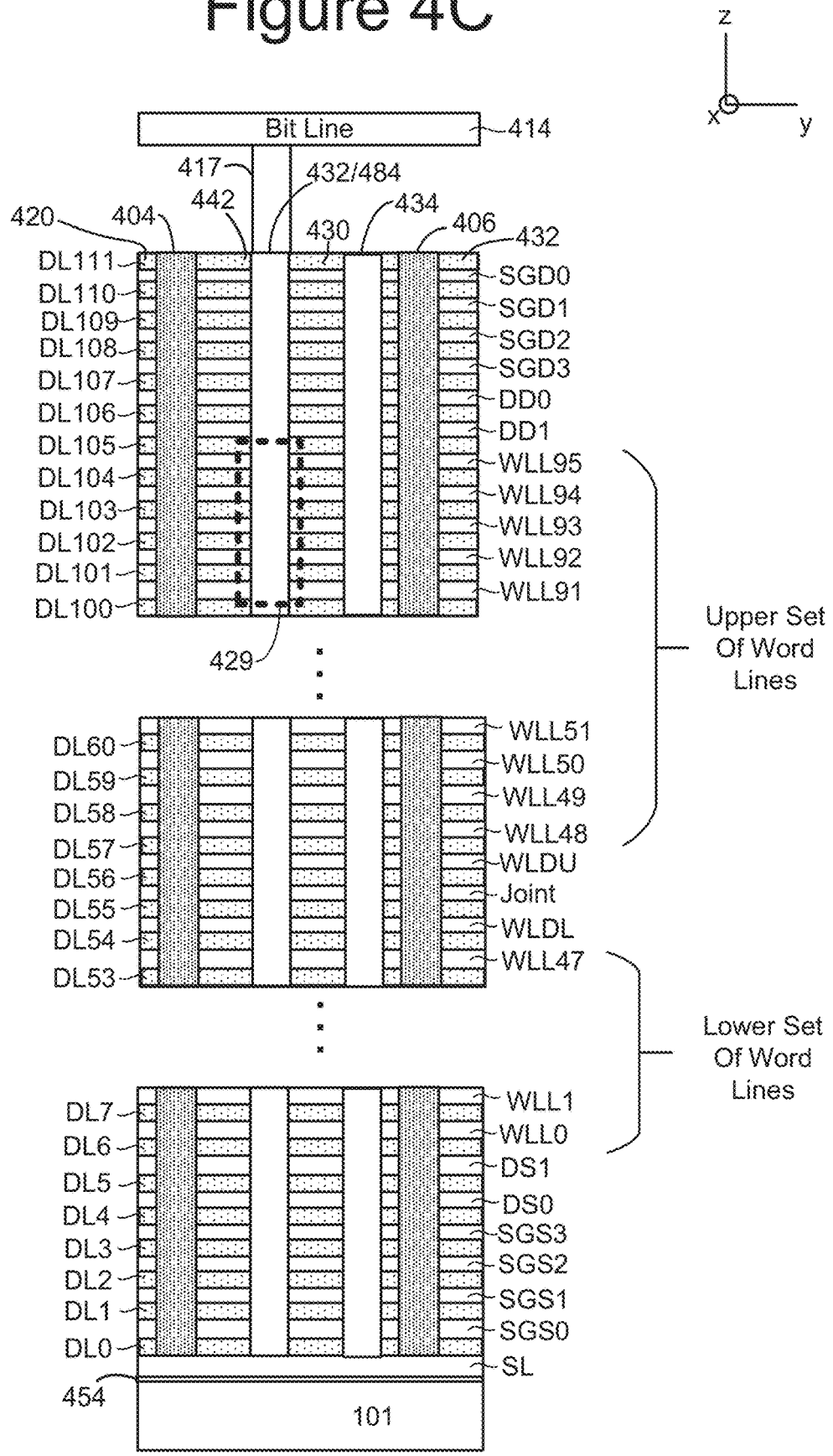
FIG. 4C depicts a cross sectional view of a portion of a block of memory cells.

FIG. 4C depicts a portion of one embodiment of a three dimensional memory structure 326 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; six dummy word line layers DD0, DD1, DS0, DS1, WLDL, WLDU; and ninety six data word line layers WLL0-WLL95 for connecting to data memory cells. Other embodiments can implement more or less than four drain side select layers, more or less than four source side select layers, more or less than six dummy word line layers, and more or less than ninety six word lines. Vertical columns 432 and 434 are depicted protruding through the drain side select layers, source side select layers, dummy word line layers and word line layers. In one embodiment, each vertical column comprises a vertical NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 417. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0, DS1, WLDL and WLDU; and data word line layers WLL0-WLL95 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL111. For example, dielectric layers DL104 is above word line layer WLL94 and below word line layer WLL95. In one embodiment, the dielectric layers are made from $SiO_2$. In other embodiments, other dielectric materials can be used to form the dielectric layers.

In one embodiment, drain side select layers SGD0, SGD1, SGD2 and SGD3 drain side selection lines; source side select layers SGS0, SGS1, SGS2 and SGS3 implement source side selection lines; dummy word line layers DD0, DD1, DS0, DS1, WLDL and WLDU implement dummy word lines; and data word line layers WLL0-WLL95 implement data word lines. In one embodiment, data word lines, dummy word lines, drain side selection lines and source side selection lines are all referred to generically as word lines.

The non-volatile memory cells are formed along vertical columns which extend through alternating conductive and dielectric layers in the stack. In one embodiment, the memory cells are arranged in NAND strings. The word line layers WLL0-WLL95 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4C also shows a Joint area. In one embodiment it is expensive and/or challenging to etch ninety six word line layers intermixed with dielectric layers. To ease this burden, one embodiment includes laying down a first stack of forty eight word line layers alternating with dielectric layers, laying down the Joint area, and laying down a second stack of forty eight word line layers alternating with dielectric layers. The Joint area is positioned between the first stack and the second stack. The Joint area is used to connect to the first stack to the second stack. In FIG. 4C, the first stack is labeled as the "Lower Set of Word Lines" and the second stack is labeled as the "Upper Set of Word Lines." In one embodiment, the Joint area is made from the same materials as the word line layers. In one example set of implementations, the plurality of word lines (word lines are one example of control lines, bit lines can also be considered control lines) comprises a first stack of alternating word line layers and dielectric layers, a second stack of alternating word line layers and dielectric layers, and a joint area between the first stack and the second stack, as depicted in FIG. 4C.

Figure 4D:
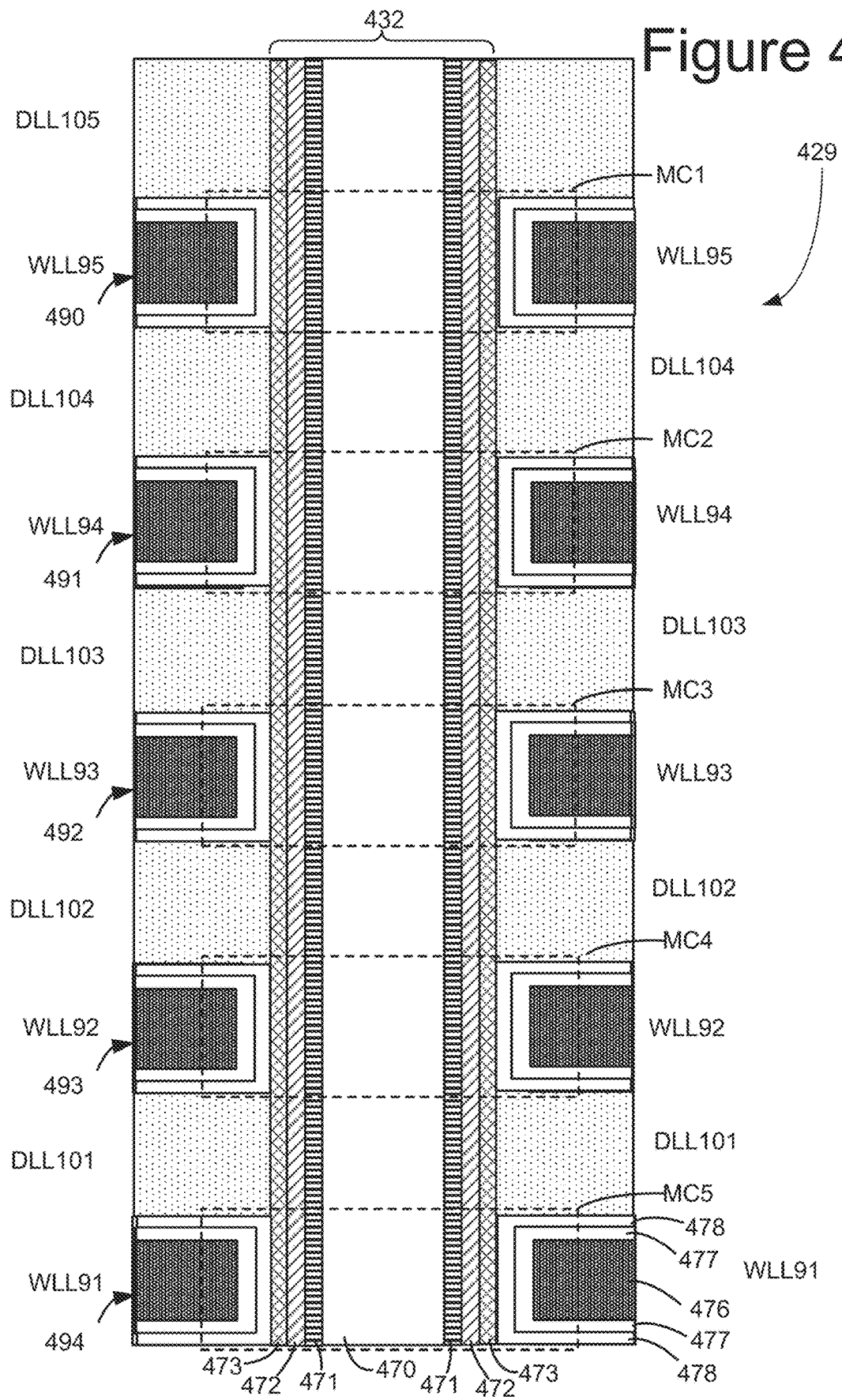
FIG. 4D is a cross sectional view of a vertical column of memory cells.

FIG. 4D depicts a cross sectional view of region 429 of FIG. 4C that includes a portion of vertical column 432 (a memory hole). In one embodiment, the vertical columns are round; however, in other embodiments other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line and the source line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4D depicts dielectric layers DLL105, DLL104, DLL103, DLL102 and DLL101, as well as word line layers WLL95, WLL94, WLL93, WLL92, and WLL91. Each of the word line layers includes a word line region 476 surrounded by an aluminum oxide layer 477, which is surrounded by a blocking oxide layer 478. In other embodiments, the blocking oxide layer can be a vertical layer parallel and adjacent to charge trapping layer 473. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL95 and a portion of vertical column 432 comprise a memory cell MC1. Word line layer WLL94 and a portion of vertical column 432 comprise a memory cell MC2. Word line layer WLL93 and a portion of vertical column 432 comprise a memory cell MC3. Word line layer WLL92 and a portion of vertical column 432 comprise a memory cell MC4. Word line layer WLL91 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4E:
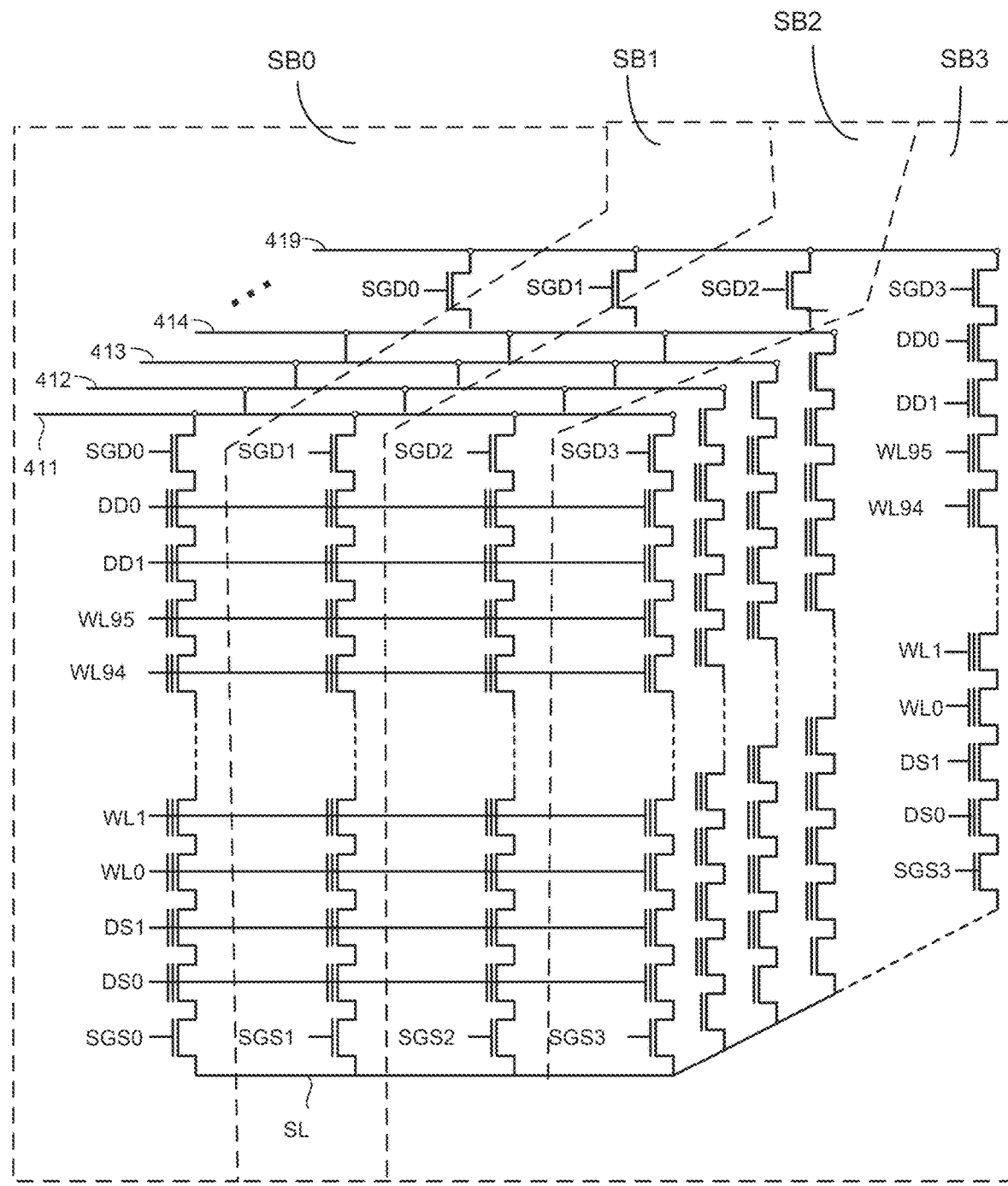
FIG. 4E is a schematic of a plurality of NAND strings showing multiple sub-blocks.

FIG. 4E is a schematic diagram of a portion of the memory depicted in in FIGS. 3-4D. FIG. 4E shows physical data word lines WLL0-WLL95 running across the entire block. The structure of FIG. 4E corresponds to portion 306 in Block 2 of FIGS. 4A-D, including bit lines 411, 412, 413, 414, . . . 419. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 3-4E is a three dimensional memory structure that includes vertical NAND strings with charge-trapping material, other (2D and 3D) memory structures can also be used with the technology described herein.

Figures 5, 6:
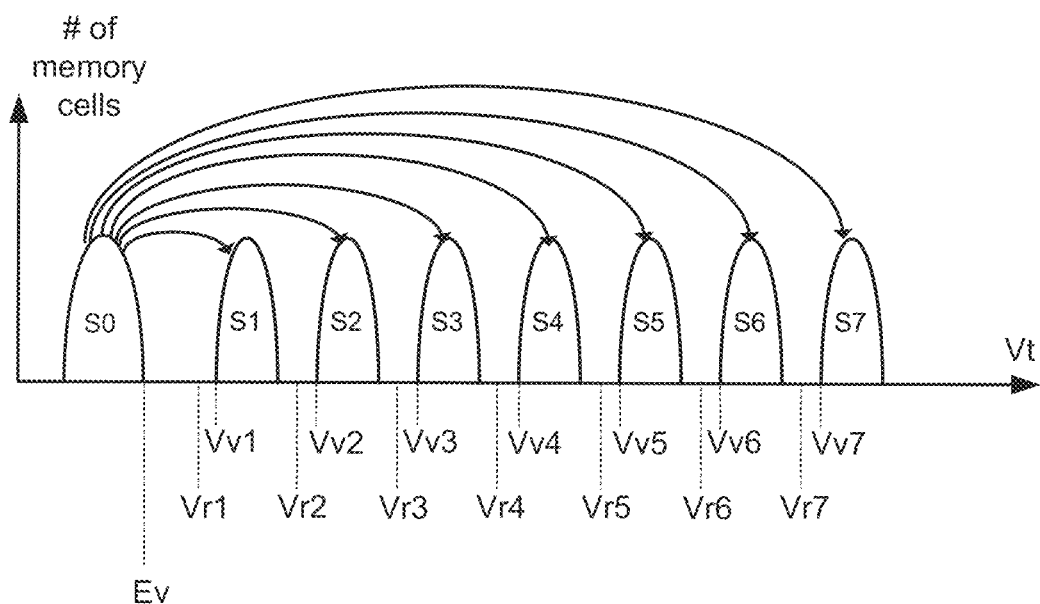
FIG. 5 depicts threshold voltage distributions.
FIG. 6 is a table describing one example of an assignment of data values to data states.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 is a graph of threshold voltage versus number of memory cells, and illustrates example threshold voltage distributions for the memory array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. For a data state N, that data state N has higher threshold voltages than data state N−1 and lower threshold voltages than data state N+1. The first threshold voltage distribution (data state) S0 represents memory cells that are erased. The other seven threshold voltage distributions (data states) S1-S7 represent memory cells that are programmed and, therefore, are also called programmed states or programmed data states. In some embodiments, data states S1-S7 can overlap, with controller 122 relying on error correction to identify the correct data being stored.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7 (also referred to as verify target voltages). When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming including (but not limited to) multiple stage/phase programming.

Each threshold voltage distribution (data state) of FIG. 5 corresponds to predetermined values for the set of data bits stored in the memory cells. The specific relationship between the data programmed into the memory cell and the threshold voltage levels of the memory cell depends upon the data encoding scheme adopted for the memory cells. In one embodiment, data values are assigned to the threshold voltage ranges using a Gray code assignment so that if the threshold voltage of a memory erroneously shifts to its neighboring physical state, only one bit will be affected.

FIG. 6 is a table describing one example of an assignment of data values to data states. In the table of FIG. 6, S0=111 (erased state), S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 5) or verify operation (e.g. see verify reference voltages Ev, Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 7:
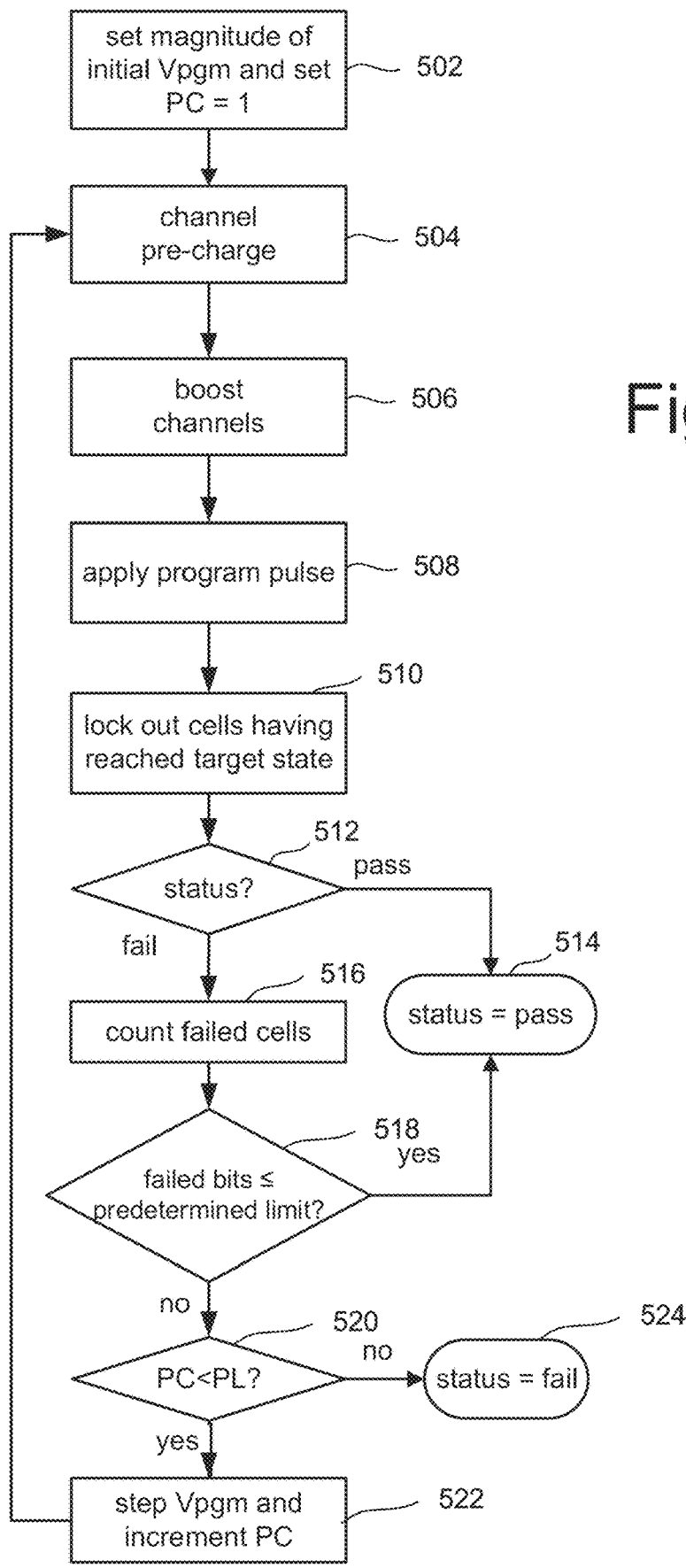
FIG. 7 is a flow chart describing one embodiment of a process for programming non-volatile memory.

FIG. 7 is a flowchart describing one embodiment of a process for programming that is performed by memory die 200 and/or integrated assembly 207. In one example embodiment, the process of FIG. 7 is performed on memory die 200 using the control circuitry (system control logic 260, column control circuitry 210, row control circuitry 220) discussed above. In one example embodiment, the process of FIG. 7 is performed by integrated memory assembly 207 using the control circuitry (system control logic 260, column control circuitry 210, row control circuitry 220) of control die 211 to program memory cells on memory die 201. The process includes multiple loops, each of which includes a program phase and a verify phase. The process of FIG. 7 is performed to implement the full sequence programming, as well as other programming schemes including multi-stage programming. When implementing multi-stage programming, the process of FIG. 7 is used to implement any/each stage of the multi-stage programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 502 of FIG. 7, the program voltage (Vpgm) is initialized to the starting magnitude (e.g., ~12-20V or another suitable level) and a program counter PC maintained by state machine 262 is initialized at 1.

In one embodiment, the set of memory cells selected to be programmed (referred to herein as the selected memory cells) are programmed concurrently and are all connected to the same data word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 504 the storage system will pre-charge channels of NAND strings that include memory cells connected to the selected word line that are to be inhibited from programming. In step 506, NAND strings that include memory cells connected to the selected word line that are to be inhibited from programming have their channels boosted to inhibit programming. Such NAND strings are referred to herein as "unselected NAND strings." In one embodiment, the unselected data word lines receive one or more boosting voltages (e.g., ~7-11 volts) to perform boosting schemes. A program inhibit voltage is applied to the bit lines coupled the unselected NAND string.

In step 508, a program pulse (e.g., voltage pulse) of the program signal Vpgm is applied to the selected word line (the data word line selected for programming). If a memory cell on a NAND string should be programmed, then the corresponding bit line is biased at a program enable voltage, in one embodiment. Herein, such a NAND string is referred to as a "selected NAND string." In step 508, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all the memory cells connected to the selected word line will concurrently have their Vt change, unless they are inhibited from programming.

In step 510, memory cells that have reached their target states are locked out from further programming. Step 510 may include performing verifying at one or more verify reference levels. In one embodiment, the verification process is performed by testing whether the threshold voltages of the memory cells selected for programming have reached the appropriate verify reference voltage.

In step 510, a memory cell may be locked out after the memory cell has been verified (by a test of the Vt) that the memory cell has reached its target state. If, in step 512, it is determined that all of the memory cells have reached their target threshold voltages (pass), the programming process is complete and successful because all selected memory cells were programmed and verified to their target states. A status of "PASS" is reported in step 514. Otherwise if, in step 512, it is determined that not all the memory cells have reached their target threshold voltages (fail), then the programming process continues to step 516.

In step 516, the system counts the number of memory cells that have not yet reached their respective target Vt distribution. That is, the system counts the number of memory cells that have, so far, failed to reach their target state. This counting can be done by the state machine 262, the memory controller 120, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 518, it is determined whether the count from step 516 is less than or equal to a predetermined limit. In one embodiment, the predetermined limit is the number of bits that can be corrected by error correction codes (ECC) during a read process for a page (e.g., the unit of programming and the unit of reading) of memory cells. If the number of failed cells is less than or equal to the predetermined limit, than the programming process can stop and a status of "PASS" is reported in step 514. In this situation, enough memory cells programmed correctly such that the few remaining memory cells that have not been completely programmed can be corrected using ECC during the read process. In some embodiments, the predetermined limit used in step 518 is below the number of bits that can be corrected by error correction codes (ECC) during a read process to allow for future/additional errors. When programming less than all of the memory cells for a page, or comparing a count for only one data state (or less than all states), than the predetermined limit can be a pro-rata (or other) portion of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 520 and the program counter PC is checked against the program limit value (PL). Examples of program limit values include 1, 12, 16, 20 and 30; however, other values can be used. If the program counter PC is not less than the program limit value PL, then the program process is considered to have failed and a status of FAIL is reported in step 524. If the program counter PC is less than the program limit value PL, then the process continues at step 522 during which time the Program Counter PC is incremented by 1 and the program voltage Vpgm is stepped up to the next magnitude. For example, the next pulse will have a magnitude greater than the previous pulse by a step size (e.g., a step size of 0.1-1.0 volts). After step 522, the process loops back to step 504 and another program pulse is applied to the selected word line so that another iteration (steps 504-522) of the programming process of FIG. 7 is performed.

Because it is possible that errors can occur when programming or reading, and errors can occur while storing data (e.g., due to electrons drifting, data retention issues or other phenomenon), error correction is used with the programming of data. Memory systems often use Error Correction Codes (ECC) to protect data from corruption. Many ECC coding schemes are well known in the art. These conventional error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as ½). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word.

The particular parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, memory controller 120 receives host data (also referred to as user data or data from an entity external to the memory system), also referred to as information bits, that is to be stored non-volatile memory structure 202. The informational bits are represented by the matrix i=[1 0] (note that two bits are used for example purposes only, and many embodiments have code words longer than two bits). An error correction coding process (such as any of the processes mentioned above or below) is implemented by ECC engine 158 of memory controller 120 in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, January 1962; and D. MacKay, Information Theory, Inference and Learning Algorithms, Cambridge University Press 2003, chapter 47. In practice, such LDPC codes are typically applied (e.g., by ECC engine 158) to multiple pages encoded across a number of memory cells, but they do not need to be applied across multiple pages. The data bits can be mapped to a logical page and stored in memory structure 202 by programming one or more memory cells to one or more programming states, which corresponds to v.

In one embodiment, programming serves to raise the threshold voltage of the memory cells to one of the programmed data states S1-S7. Erasing serves to lower the threshold voltage of the memory cells to the Erase data state S0.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the non-volatile storage elements (memory cells). Herein, this is referred to as p-well erase.

Another approach to erasing memory cells is to generate gate induced drain leakage (GIDL) current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a select transistor (e.g., SGD and/or SGS). A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to a bit line to generate a first GIDL current. A second GIDL voltage may be created between two terminals of a select transistor (e.g., source side select transistor) that is connected to a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

A non-volatile storage system in disclosed that uses multiple triple wells and groups the word line switch transistors into triple wells based on word line voltage ranges used during the programming process. In one embodiment, for a given block, the word line switch transistors connected to data word lines are positioned in a first triple well and the word line switch transistors connected to selection and dummy word lines are positioned in a second triple well. This structure allows the triple wells to be biased differently such that the voltage difference across the word line switch transistors is reduced. Since the word line switch transistors need only accommodate a smaller voltage differences than prior memory systems, the word line switch transistors can be made smaller, thereby, reducing the area on the semiconductor die used for the word line switch transistors.

As discussed above with respect to FIG. 7, one embodiment for programming comprises applying a high voltage on a selected data word line, with other voltages on unselected word lines and appropriate voltages on selection lines (e.g., SGD, SGS). The unselected data word lines are those data word lines other than the selected word line. One technique for applying the necessary voltages to the word lines is through word line switch transistors. For some techniques, in order to turn on the word line switch transistor to transfer the program voltage to the word line, the gate of the word line switch transistor needs to be biased to at least the program voltage plus the transistor's threshold voltage. Therefore, in some cases the voltage applied to the gate of the word line switch transistor could be ~29 volts. In the past, all word line switch transistors are implemented in a common triple well that is typically biased at 0 volts during programming. Therefore, the word line switch transistors will need to be big enough to reliably absorb the stress of 29 volts across the gate to the channel. However, it is proposed herein to reduce the voltage across the word line switch transistor to allow for fabricating a smaller word line switch transistor. That is, the word line switch transistor can be made smaller if it need only reliably operate with a smaller voltage than that of the past.

The largest voltage across the word line transistor occurs during programming. To reduce the voltage across the word line switch transistors, it is proposed to use multiple triple wells and group the word line switch transistors into triple wells based on word line voltage ranges used during the programming process. In one embodiment, for a given block, the word line switch transistors connected to data word lines are positioned in a first triple well and the word line switch transistors connected to selection and dummy word lines are positioned in a second triple well. This structure allows the triple wells to be biased differently such that the voltage difference across the word line switch transistors is reduced. Since the word line switch transistors need only accommodate smaller voltage differences than prior memory systems, the word line switch transistors can be smaller, thereby, reducing the area on the semiconductor die used for the word line switch transistors.

Figure 8:
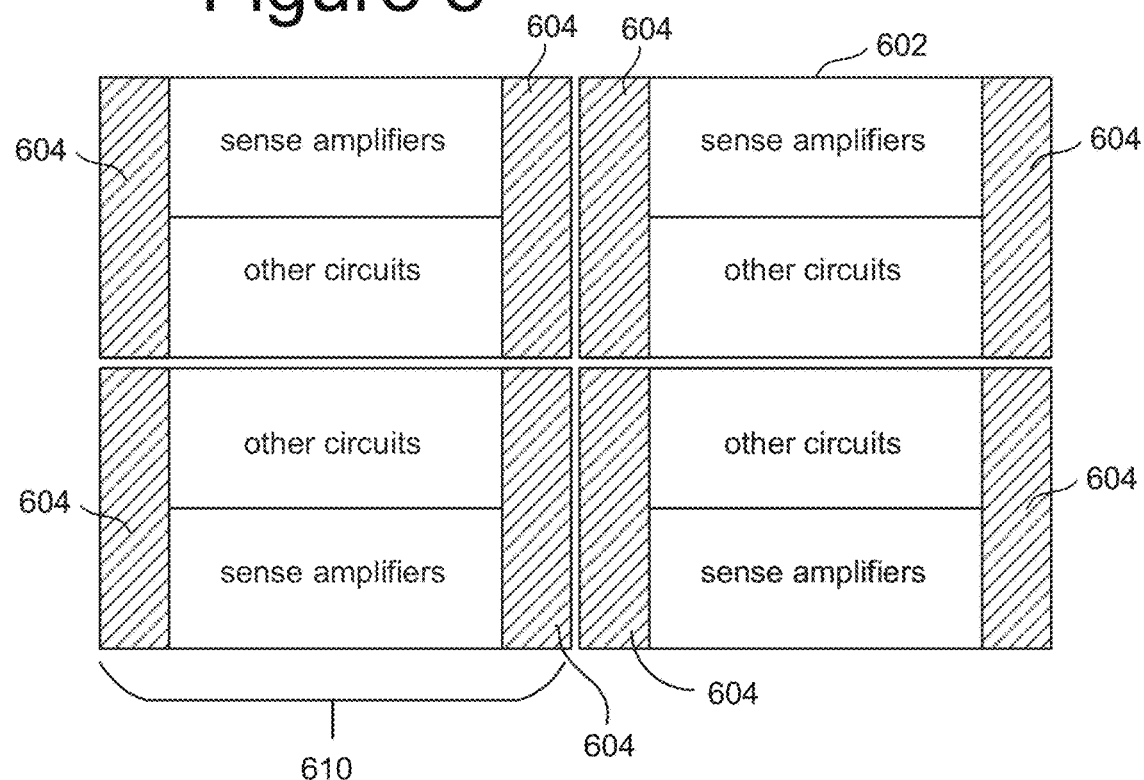
FIG. 8 is depicts a top view of a top surface of a semiconductor die.

FIG. 8 shows a top view looking down on the top surface of substrate 602 of a control die 211 or the top surface of the peripheral region of a memory die 200 that implements the circuits other than the memory array 202. In one embodiment of memory die 200, the memory array is formed over and on top of the peripheral circuits. FIG. 8 shows peripheral circuits for four planes of memory cells; however, only the peripheral circuits 610 for one plane is labeled with a reference number. The peripheral circuits for each plane include sense amplifiers, other circuits (e.g., any one of or any combination of system control logic 260, all or a portion of row control circuitry 200, all or a portion of column control circuitry 210, a microcontroller, a microprocessor, and/or other similar functioned circuits) and triple well areas 604. In one embodiment, the triple well areas 604 include one or more triple wells, such that word line switch transistors for the respective plane are implemented in the respective triple wells of respective triple well areas 604. Although not depicted in FIG. 8, in some embodiments, the memory array 202 is implemented (on memory die 200 or memory die 201) in its own triple well (referred to as the memory triple well). In one embodiment, memory array 202 is implemented in multiple memory triple wells.

Figure 9:
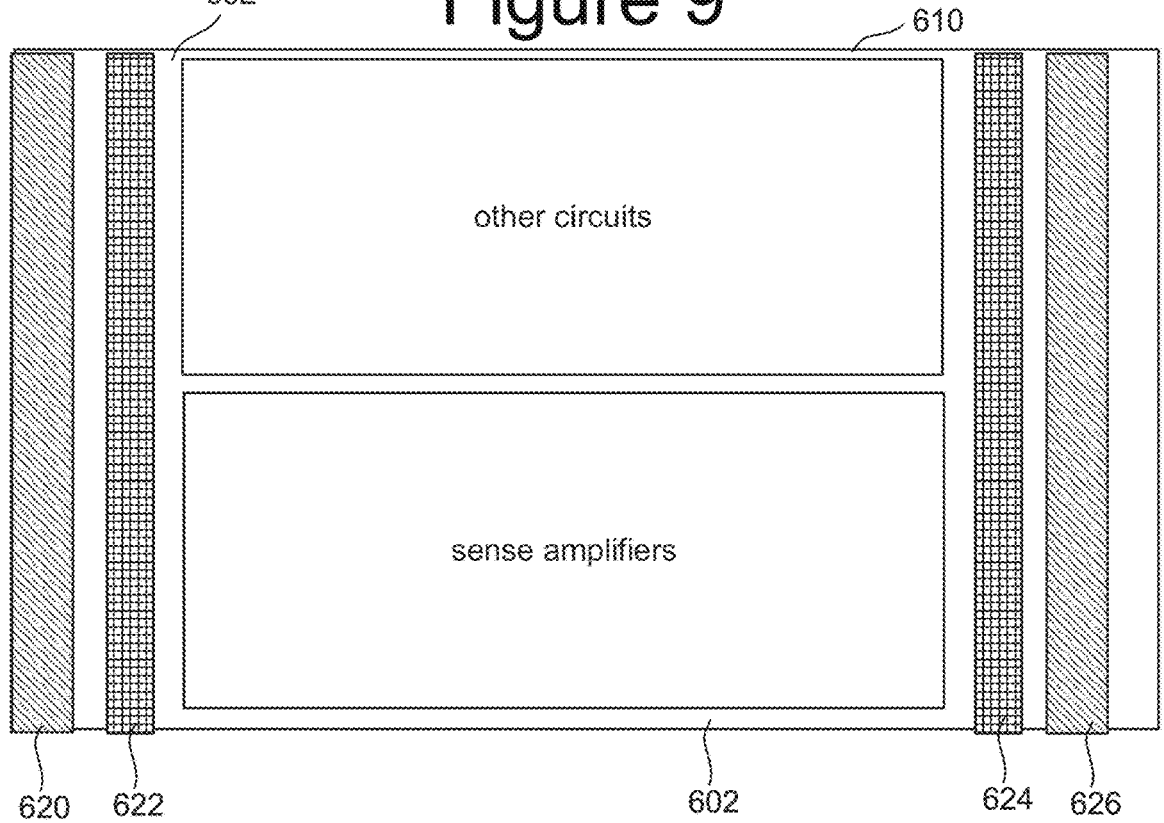
FIG. 9 is depicts a more detailed view of a portion of the semiconductor die.

FIG. 9 shows a top view looking down on the top surface of substrate 602 for the peripheral circuits 610 for one plane of memory 202. In one embodiment, the peripheral circuits for other planes are similar in structure (however in some cases the position of the "sense amplifiers" and "other circuits" are swapped). FIG. 9 depicts that peripheral circuits 610 includes a first triple well 620, a second triple well 622, a third triple well 624 and a fourth triple well 626. In other embodiments, only two triple wells are included (e.g., first triple well 620 and second triple well 622) or more than four triple wells are included. The triple wells of FIG. 9 are in addition to one or more memory triple wells mentioned above. In one embodiment, word line switch transistors for data word lines (e.g., WL0, WL1, WL2, . . . ) are implemented in triple wells 620 and 626, and word line switch transistors for selection word lines (SGS0, SGD0, . . . ) and dummy word lines (DD), DS0, . . . ) are implemented in triple wells 622 and 624. In other embodiments, other arrangements can be implemented.

Triple well 620 is for word line switch transistors on one side of the memory array and triple well 626 is for word line switches on the other side of the memory array. In some example, word line switch transistors are only on one side of the memory array, so only one of triple wells 620 and 626 are implemented.

Triple well 622 is for word line switch transistors on one side of the memory array and triple well 624 is for word line switches on the other side of the memory array. In some example, word line switch transistors are only on one side of the memory array, so only one of triple wells 622 and 624 are implemented.

In some embodiments, memory array 202 is implemented over and on top of "other circuits" and "sense amplifiers" such that the word line switch transistors are positioned on each side of (and under) the memory array. The plane of memory cells corresponding to the peripheral circuits 610 includes multiple blocks, each block has its own set of word lines, and each block has its own set of word line switch transistors on one or both sides of the respective block.

In one embodiment, the word line switch transistors are divided into two groups in order to match voltage ranges used during programming. In one example, programming data memory cells comprises applying voltages between 3 volts and 23.5 volts to the data word lines and 0 to 10.2 volts to the selection word lines and dummy word lines. If only one triple well was used, then the word line switch transistors would see between 0 and 23.5 volts (plus the Vt of the word line switch transistors)-a 23.5 volt range. By diving the word line switch transistors into two triple wells (or two sets of triple wells), then data word line switches only experience a 19.5 volt range and selection/dummy word line switches only experience a 10.2 volt range. Decreasing the voltage range allows for the word line switch transistors to be made smaller in size.

Figure 10:
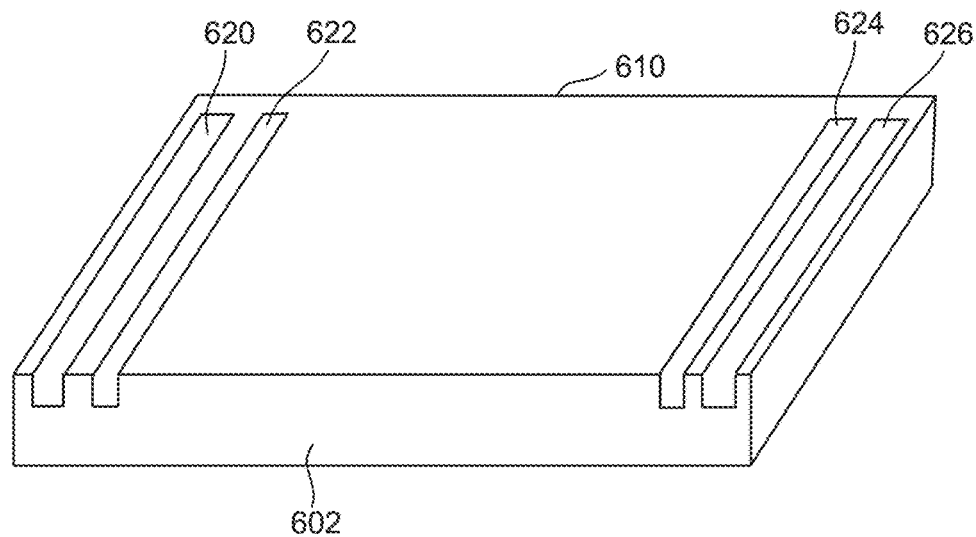
FIG. 10 is depicts a perspective view of the same portion of the semiconductor die as FIG. 9.

FIG. 10 shows a perspective view of the same portion of substrate 602 as depicted in FIG. 9, showing the area for peripheral circuits 610 for one plane of memory 202. FIG. 10, like FIG. 9, depicts that peripheral circuits 610 include first triple well 620, second triple well 622, third triple well 624 and fourth triple well 626. In other embodiments, only two triple wells are included (e.g., first triple well 620 and second triple well 622) or more than four triple wells are included. The triple wells of FIGS. 9 and 10 are in addition to one or more memory triple wells mentioned above. In one embodiment, word line switch transistors for data word lines (e.g., WL0, WL1, WL2, . . . ) are implemented in triple wells 620 and 626, and word line switch transistors for selection word lines (SGS0, SGD0, . . . ) and dummy word lines (DD), DS0, . . . ) are implemented in triple wells 622 and 624. In other embodiments, other arrangements can be implemented.

Figure 11:
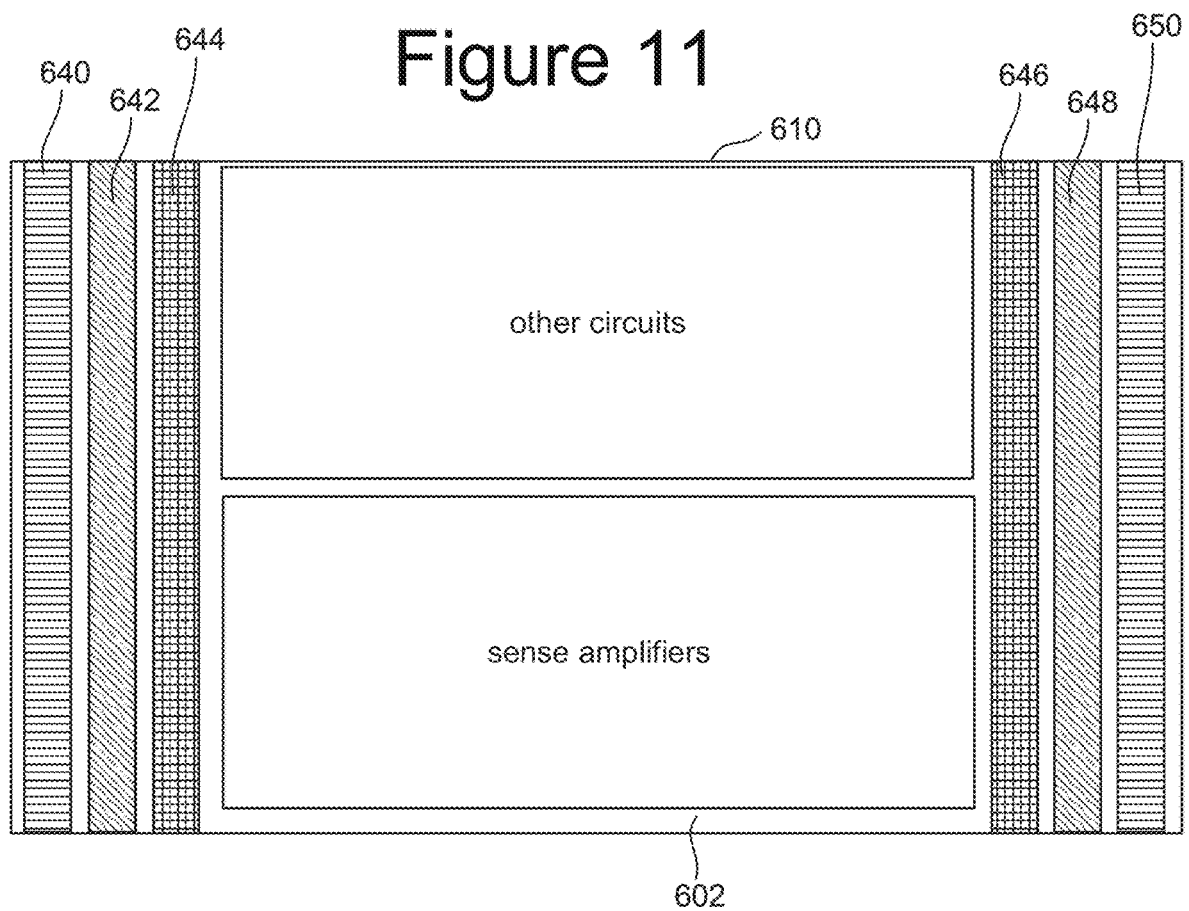
FIG. 11 is depicts a top view of another embodiment of a semiconductor die.

FIG. 11 shows a top view looking down on another embodiment of the top surface of substrate 602 for the peripheral circuits 610 for one plane of memory 202. The embodiment of FIG. 11 depicts that peripheral circuits 610 includes triple well 640, triple well 642, triple well 644, triple well 646, triple well 648 and triple well 650. The triple wells of FIG. 11 are in addition to one or more memory triple wells mentioned above.

In one embodiment, word line switch transistors for even data word lines (e.g., WL0, WL2, WL4, . . . ) are implemented in triple wells 640 and 650. Triple well 640 is for word line switch transistors on one side of the memory array and triple well 650 is for word line switches on the other side of the memory array. In some examples, word line switch transistors are only on one side of the memory array, so only one of triple wells 640 and 650 are implemented.

In one embodiment, word line switch transistors for odd data word lines (e.g., WL1, WL3, WL5, . . . ) are implemented in triple wells 642 and 648. Triple well 642 is for word line switch transistors on one side of the memory array and triple well 648 is for word line switches on the other side of the memory array. In some examples, word line switch transistors are only on one side of the memory array, so only one of triple wells 642 and 648 are implemented. In some embodiments, triple wells 642 and 648 will be biased at different voltages than triple wells 640 and 650 (e.g., during programming).

In one embodiment, word line switch transistors for selection word lines (SGS0, SGD0, . . . ) and dummy word lines (DD), DS0, . . . ) are implemented in triple wells 644 and 646. Triple well 644 is for word line switch transistors on one side of the memory array and triple well 646 is for word line switches on the other side of the memory array. In some examples, word line switch transistors are only on one side of the memory array, so only one of triple wells 644 and 646 are implemented.

Dividing the data word line switch transistors into separate triple wells for odd word lines and even word lines allows for further reduction in size of word line switch transistors. When programming, in some embodiments, only one word line is selected to receive the high program voltage. Thus, only one of the odd word lines or the even word lines receives the high program voltage. In one example embodiment, the word lines of either the odd word lines or the even word lines that receives the high program voltage will receive a range of voltages between 10.2v-23.5, and the other group of word lines will receive a range of voltages of 5v-10.2v. For example, if WL5 is selected for programming, then odd word lines will receive a range of voltages between 10.2v-23.5, and the even word lines will receive a range of voltages of 5v-10.2v. These ranges are smaller than the ranges if odd and even word lines are grouped together; therefore, the word line switch transistors needs only experience a smaller voltage range of 13.3v. This can be accomplished by biasing the triple well for the selected group (even word lines or odd word lines) at 10.2 volts while biasing the triple well for the selected group as well as the memory triple well at 0v. An alternative embodiment, biases the triple well for the selected group (even word lines or odd word lines) at 0 volts while biasing the triple well for the selected group as well as the memory triple well at −10.2v. In other embodiments, the word line switch transistors can be grouped by criteria other than even and odd word lines.

Figure 12:
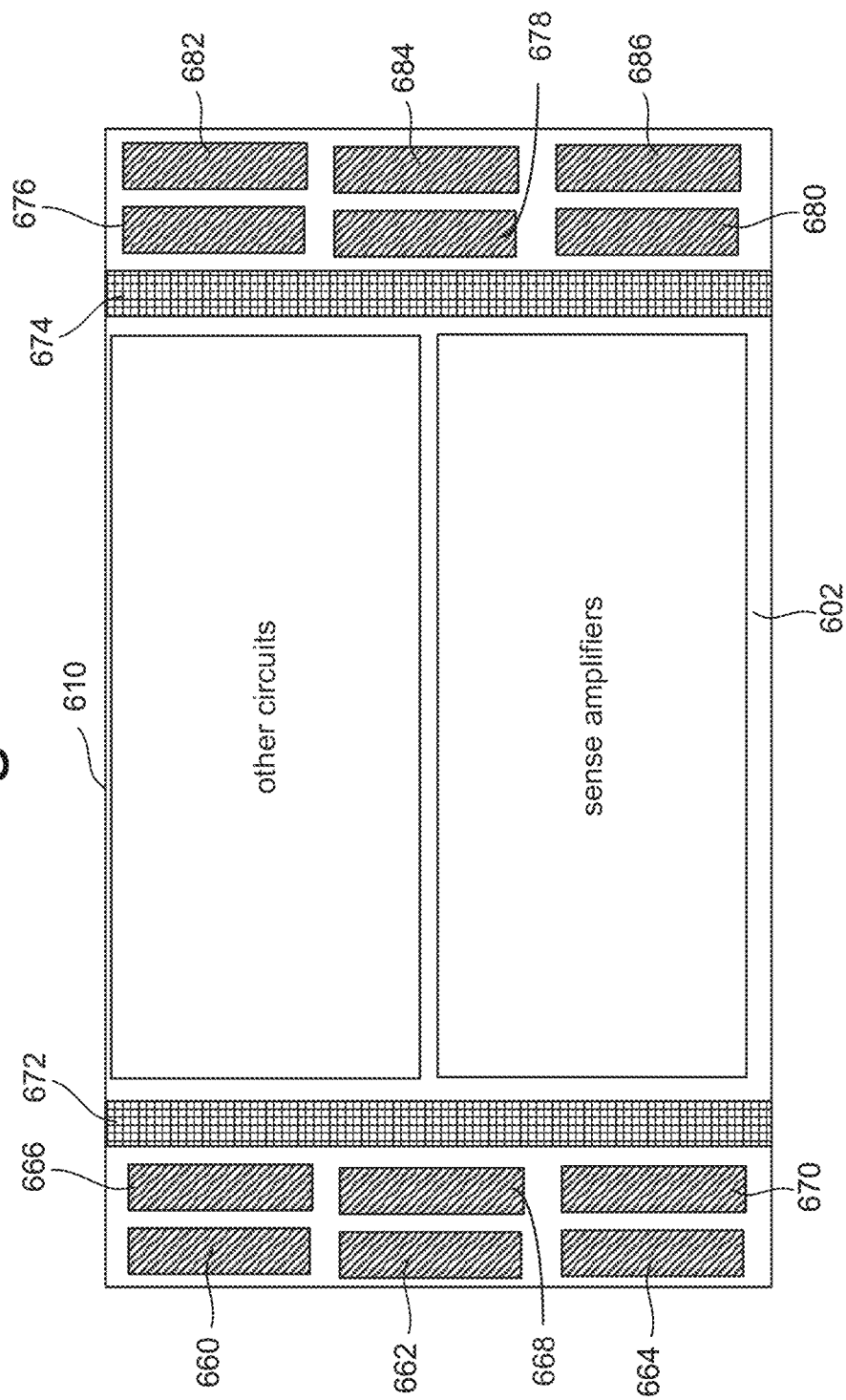
FIG. 12 is depicts a top view of another embodiment of a semiconductor die.

Although FIG. 11 shows three triple wells on each side, more or less than three triple wells can be implemented on each side. For example, FIG. 12 shows a top view looking down on another embodiment of the top surface of substrate 602 for the peripheral circuits 610 for one plane of memory 202. The embodiment of FIG. 12 depicts that peripheral circuits 610 includes triple well 660, triple well 662, tripe well 664, triple well 666, triple well 668, triple well 670, triple well 672, triple well 674, triple well 676, triple well 678, triple well 680, triple well 682, triple well 684 and triple well 686. The triple wells of FIG. 12 are in addition to one or more memory triple wells mentioned above. In some embodiments, double wells or other types of wells can be used, rather than triple wells.

In one embodiment, word line switch transistors for data word lines (e.g., WL0, WL1, WL2, . . . ) are implemented in triple well 660, triple well 662, triple well 664, triple well 666, triple well 668, triple well 670, triple well 676, triple well 678, triple well 680, triple well 682, triple well 684 and triple well 686. Triple wells 660-670 are for word line switch transistors on one side of the memory array and triple wells 676-686 are for word line switches on the other side of the memory array. In some examples, word line switch transistors are only on one side of the memory array. The word line switch transistors for data word lines can be divided into triple wells 660-670 based on any strategy that is suitable for a given memory implementation/architecture such that word line switch transistors are grouped into triple wells based on word line voltage ranges used during the programming process.

In one embodiment, word line switch transistors for selection word lines (SGS0, SGD0, . . . ) and dummy word lines (DD), DS0, . . . ) are implemented in triple wells 672 and 674. Triple well 672 is for word line switch transistors on one side of the memory array and triple well 674 is for word line switches on the other side of the memory array. In some examples, word line switch transistors are only on one side of the memory array, so only one of triple wells 672 and 674 are implemented. In one embodiment, word line switch transistors for selection word lines (SGS0, SGD0, . . . ) and dummy word lines (DD), DS0, . . . ) can be subdivided into more triple wells than depicted in FIGS. 9-12.

FIG. 12 is an example of multiple pluralities of control line switches connected to multiple subsets of the word (control) lines such that the multiple pluralities of word line switches are positioned in multiple wells, the non-volatile memory comprises a block of non-volatile memory cells, and the multiple subsets of the word lines are connected to the block of non-volatile memory cells.

Figure 13:
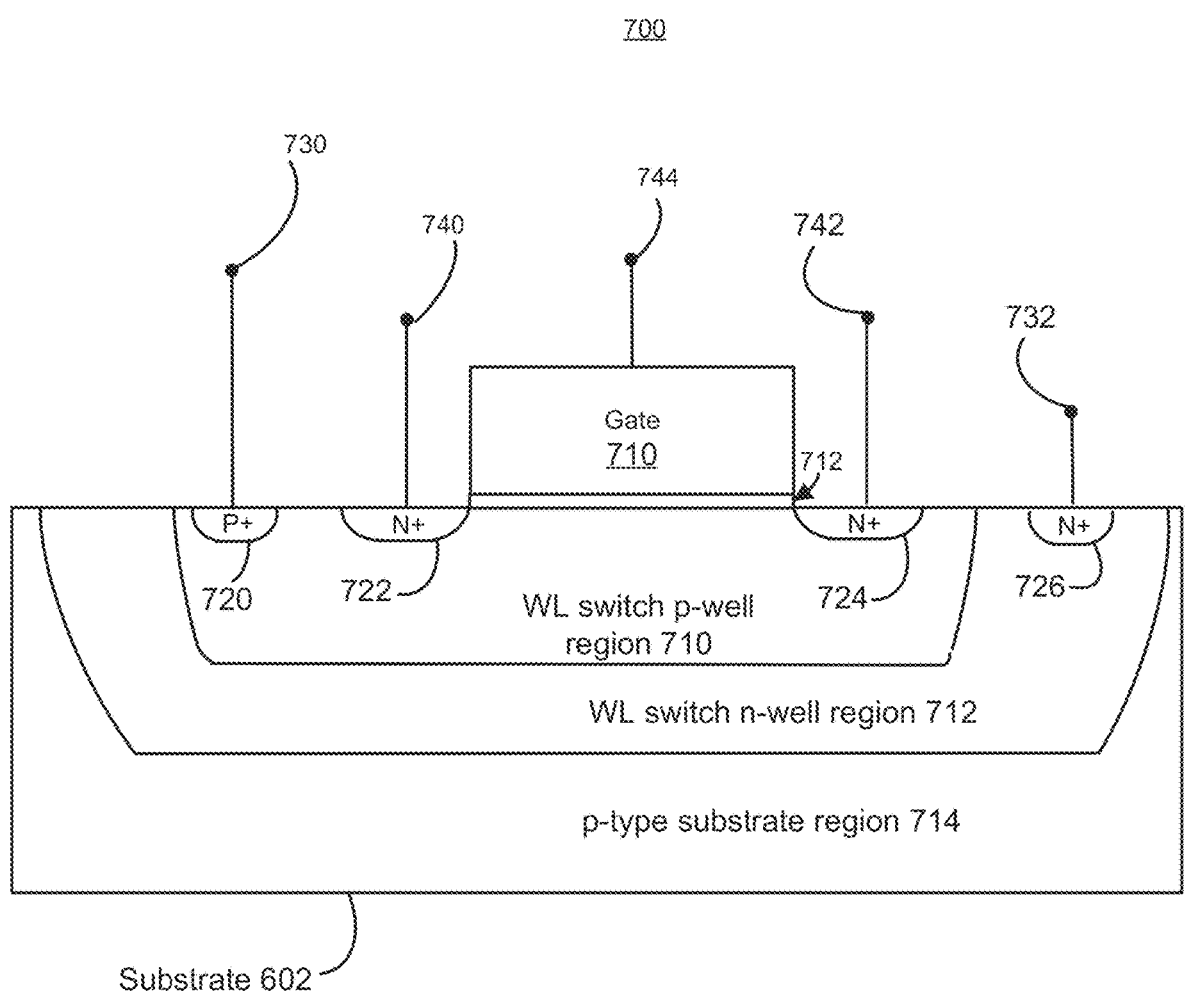
FIG. 13 is a cross section of one embodiment of a word line switch transistor.

FIG. 13 depicts one embodiment of a word line switch transistor 700, which may be used to provide a voltage to a word line and is positioned in one of the triple wells discussed above. In one embodiment, the substrate 602 employs a triple-well technology which includes a WL switch p-well region 710 within a WL switch n-well region 712, which in turn is within a p-type substrate region 714. Each of WL switch p-well region 710, WL switch n-well region 712, and p-type substrate region 714 are wells. Wells 710, 712, 714 may be independently biased from the wells of the NAND strings of memory array 202.

The WL switch p-well region 710 has a P+ region 720 in one embodiment to provide better electrical contact to terminal 730 for applying a p-well voltage $V_{P\_WELL}$ to p-well region 710. The n-well region 712 has an N+ region 726 in one embodiment to provide better electrical contact to terminal 732 for applying a n-well voltage $V_{N\_WELL}$ 466 to n-well region 712. In one embodiment, $V_{N\_WELL}$ for the data word line switches is set to the same voltage as $V_{P\_WELL}$ for the word line switch transistors for selection word lines (SGS0, SGD0, . . . ) and dummy word lines (DD, DS0, . . . ) during program operations; however, other voltages could be used. In one embodiment, the p-type substrate region 496 remains grounded while operating the memory device.

In this embodiment, the WL switch transistor 700 has two N+ regions 722, 724, one of which may be a source and the other a drain. One N+ region 722 is connected to one of the word lines in the memory array 202 via terminal 740 (and can be referred to as an output terminal). A voltage may be applied to the other N+ region 724 via terminal 742 (input terminal) to be transferred to the output terminal when WL switch transistor 700 has been turned on. The transistor has a gate 710 over a gate oxide 712. A gate voltage may be applied to gate 710 via terminal 744 (selection terminal) to turn on or off WL switch transistor 700. In one embodiment, a "selection voltage" is applied to the gate 710 to turn transistor 700 on, and an "deselect voltage" is applied to the gate 710 to keep transistor 700 off. In one embodiment, to turn on transistor 700, the selection voltage at selection terminal 744 should be above the magnitude of the input voltage at the input terminal 742 by at least the threshold voltage of transistor 700. If a selection voltage is used to turn on the transistor 450, the input voltage at the input terminal 742 may be passed through to the word line.

In one embodiment, all or a subset of word line switch transistors are implemented in double wells.

In one embodiment, all word line switch transistors are in triple wells. In another embodiment, some word line switch transistors are in triple wells and some word line switch transistors are implemented in p-type substrate region 14 (which is a well) or other substrate region (which is a well). For example, in one embodiment, word line switch transistors connected to data word lines are in triple wells and word line switch transistors connected to selection word lines are implemented in p-type substrate region 14. In another embodiment, all or a subset of word line switch transistors are implemented in p-type substrate region 14.

Figure 14:
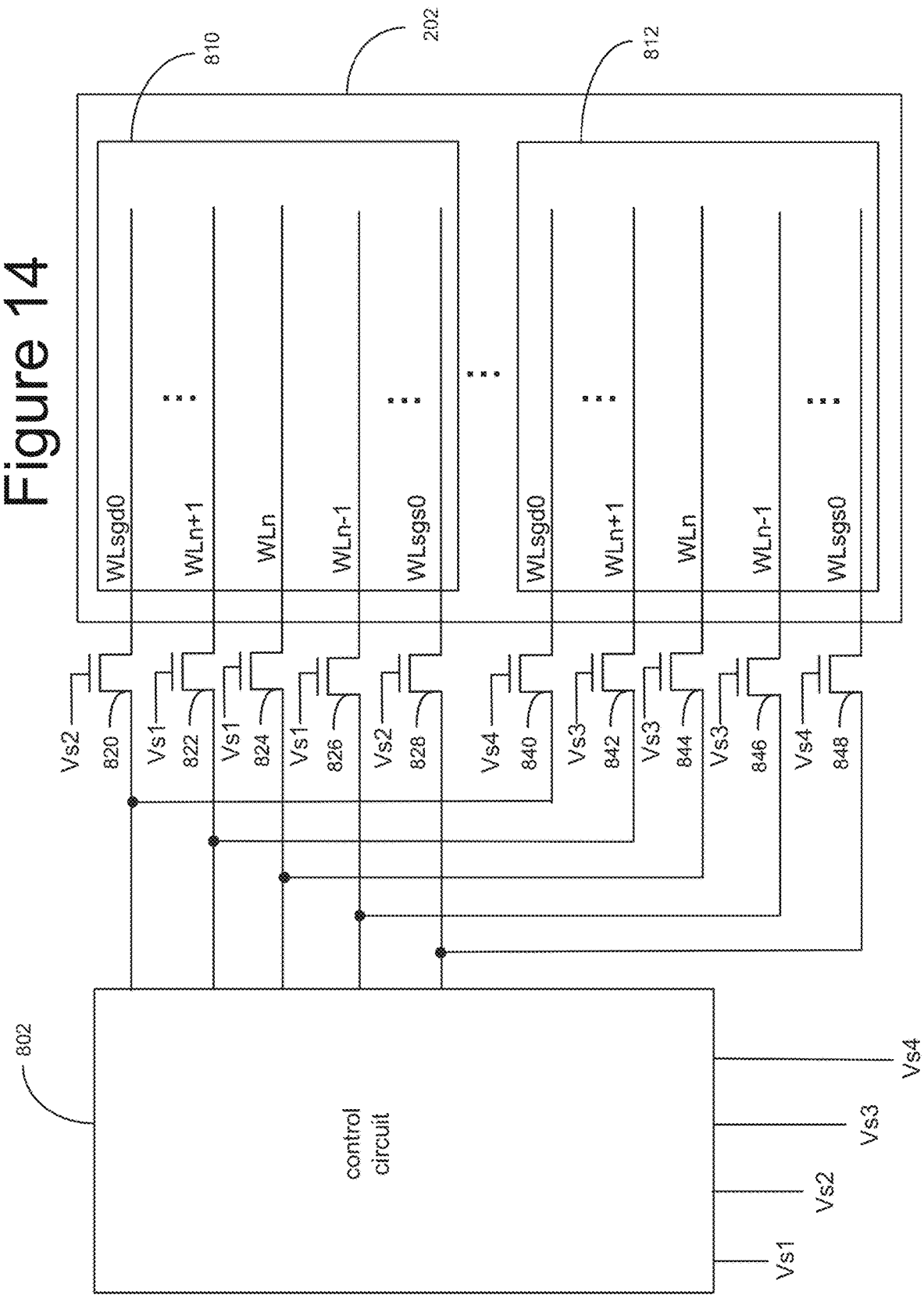
FIG. 14 is a circuit diagram of one embodiment of a portion of a memory system.

FIG. 14 depicts a schematic diagram of control circuit 802 connected to memory array 202. For memory array 202, FIG. 14 shows block 810 and block 812; however, more than two blocks would be included in memory array 202. FIG. 14 only shows two blocks to make the drawing easier to read. Control circuit 802 can be any one or more of the control circuits discussed above. In one embodiment, a portion of control circuit 802 includes the row decoders discussed above. FIG. 14 shows a plurality of word lines extending across the memory. For example, for both blocks 810 and 812, the word line depicted include WLsgs0 . . . WLn−1, WLn, WLn+1, . . . WLsgd0. The other word lines of the blocks are not explicitly depicted to make the drawing easier to read. In addition to row decoders, control circuit 802 includes one or more voltage sources that provide voltage signals which are transferred to the word lines via a plurality of word line switch transistors. For block 810, FIG. 14 shows word lines switch transistor 820 connected to WLsgd0, word line switch transistor 822 connected to WLn+1, word line switch transistor 824 connected to WLn, word line switch transistor 826 connected to WLn1 and word line switch transistor 828 connected to WLsgs0. For block 812, FIG. 14 shows word line transistor 840 connected to WLsgd0, word line switch transistor 842 connected to WLn+1, word line switch transistor 844 connected to WLn, word line switch transistor 846 connected to WLn−1 and word line switch transistor 848 connected to WLsgs0.

Each of word line transistors 820-848 are of the structure depicted in FIG. 13. Each of the word line switch transistors 820-848 have their input terminal connected to control circuit 802 for receiving a voltage to be transferred to the respective word lines via the output terminals. Control circuit 802 provides various selection signals (one or more selection voltages or one or more deselect voltages) to the selection terminals of the word line switch transistor. For example, signal VS1 is provided to word line switches 822, 824, 826; signal Vs2 is provided to word line switches 820 and 828; signal Vs3 is provided to the selection terminal 4 word line switches 842, 844 and 846 and signal Vs4 is provided to the selection terminals of word line switch transistors 840 and 848. In this manner, the word line switch transistors for a block can be turned on or turned off so that the block is selected or not selected for a particular memory operation.

FIG. 14 implements the embodiments of FIGS. 9 and 10 which includes separating the word line switch transistors (or other type of switches) for the data word lines into a different triple well than the word line switch transistors for the dummy word lines and selection word lines. Therefore, one select signal is used for data word lines (Vs1) and a second selection signal (Vs2) is used for the dummy word lines and selection word lines. Thus in the embodiment of FIG. 14, a first triple well (e.g., triple well 620 of FIG. 9) will include word line switch transistors 822, 824, 826, 842, 844 and 846 and a second triple well (e.g., triple well 622 of FIG. 9) will include word line switches 820, 828, 840 and 848. Additionally, memory array 202 will be implemented in a memory triple well that is not depicted in FIG. 14.

FIG. 15 is a flowchart describing one embodiment of a process for programming non-volatile memory. The process of FIG. 15 can be used to perform programming for the structures discussed above. For example, the process of FIG. 15 can be implemented by the structure of FIG. 14, which is an example of the structure of FIGS. 1-4E. In step 902 of FIG. 15, the system applies one or more selection voltages (e.g., Vs1, Vs2) to a first set of word line switch transistors (e.g., 820-828) connected to a first set of word lines that are connected to a first grouping (e.g., block) of non-volatile memory cells. The first set of word line switch transistors comprises a first subset of the word line transistors (e.g., 822, 824, 826) connected to a first subset of word lines for the block of non-volatile memory cells and a second subset of word line switch transistors (e.g., 820 and 828) connected to a second subset of the word lines for the block of non-volatile memory cells. The first subset of word line switch transistors are positioned in a first triple well (e.g., 620). The second subset of word line transistors are positioned in a second triple well (e.g., 622). The one or more selection voltages turn on the first set of word line switch transistors. In the example of FIG. 14, assume block 810 is selected for programming and block 812 is not selected for programming.

In step 904, the systems applies one or more deselect voltages (e.g., Vs3 and Vs4) to a second set of word line switch transistors (e.g., 840-848) connected to a second set of word lines connected to a second grouping (e.g., block) of non-volatile memory cells. The one or more deselect voltages turn off the second set of word line switch transistors, as discussed above. In step 906, the system causes (e.g., biases) the first triple well to be at a higher voltage than the second triple well while applying the one or more selection voltages to the first set of word lines switch transistors (e.g., biasing the first triple well to be in a first voltage and biasing the second triple well to be in a second voltage, the first voltage is higher than the second voltage). In step 908, the system applies a first set of programming process voltages to the first subset of word line switch transistors while applying the one or more selection voltages to the first set of word line switch transistors in order to pass the first set of programming process voltages to the first subset of word lines. The first set of programming process voltages include a program voltage that is applied to a selected word line to program one or more memory cells connected to the selected word line. For example, the first set of programming process voltages include Vpgm. The first set of programming processes voltage also includes voltages applied to other data word lines in order to perform boosting, as discussed above. In step 910, the system applies a second set of programming process voltages to the second subset of word line switch transistors while applying the one or more selection voltages to the first set of word line switch transistors in order to pass the second set of programming processes voltages to the second subset of word lines. As a result of the process of FIG. 15, a plurality of memory cells connected to the selected word line are concurrently programmed.

Figure 16:
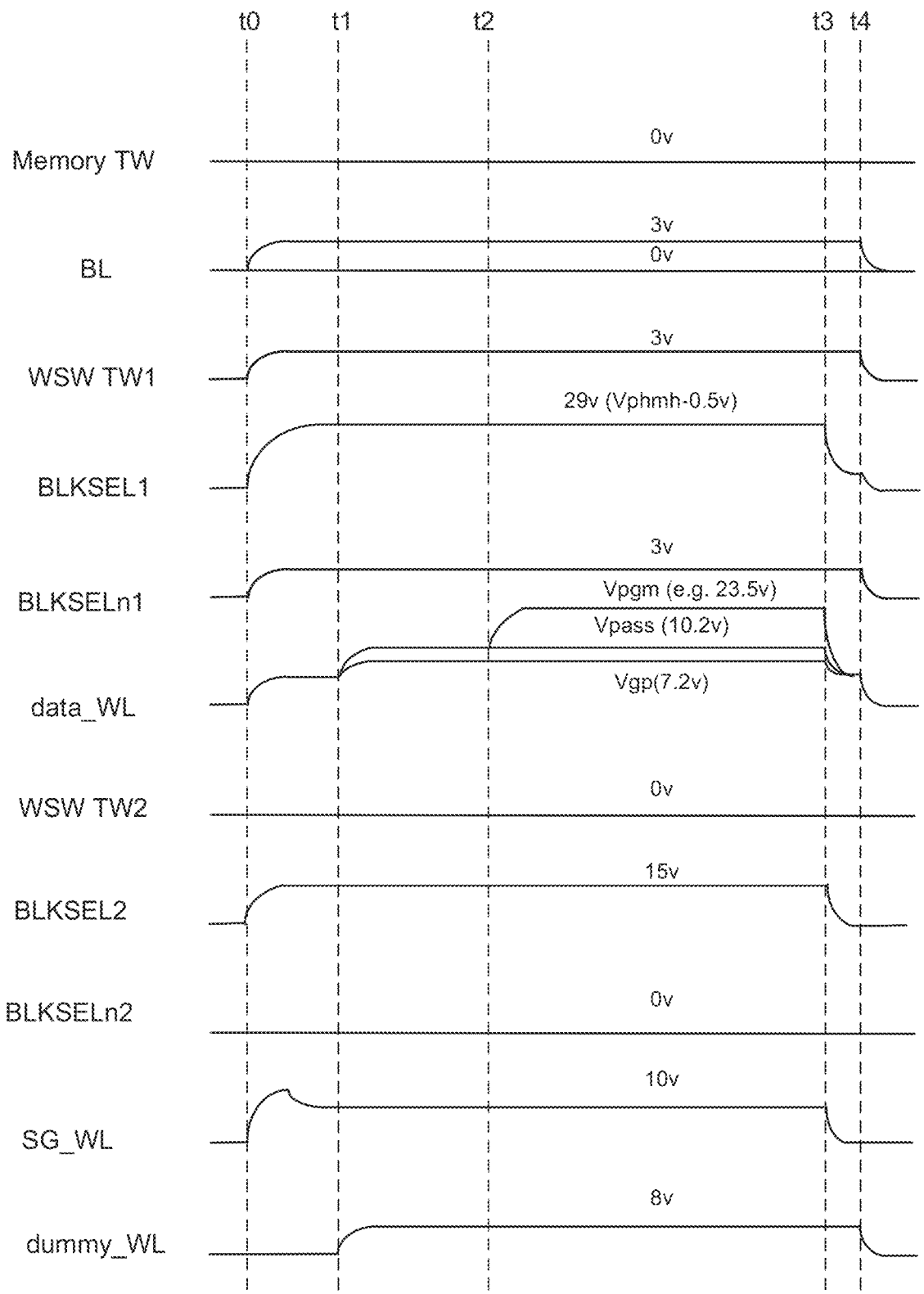
FIG. 16 is a timing diagram describing one embodiment of a process for programming non-volatile memory.

FIG. 16 is a timing diagram describing one embodiment of a process for programming non-volatile memory. The process of FIG. 16 is an example implementation of the process of FIG. 15 and can be performed by any of the structures described above with respect to FIGS. 1-4E and 14. Additionally, the process of FIG. 16 can implement any of the embodiments of FIGS. 9-12. The timing diagram of FIG. 16 shows the following signals: Memory TW, BL, WSW TW1, BLKSEL1, BLKSELn1, data_WL, WSW TW2, BLKSEL2, BLKSELn2, SG_WL, and dummy_WL. The signal Memory TW indicates the voltage at the memory triple well. The signal BL indicates the voltage on the bit lines. The signal WSW TW1 indicates the voltage on the triple well housing the word line switch transistors for the data word lines (e.g., either or both of triple wells 620 and 626 of FIG. 9). The signal BLKSEL1 is the signal sent to the gates (selection input) of the word line switch transistors for the blocks that are selected for the programming (see selection terminal 744 of FIG. 13). An example of BLK-SEL1 is Vs1 of FIG. 14. The signal BLKSELn1 is the signal sent to the gate (selection terminals) of the word line switch transistors for data word lines for blocks that are not selected (see, e.g., Vs3 of FIG. 14). The signal data_WL represents the one or more voltages applied to data word lines, including the voltage applied to the word line that is selected for programming. The signal WSW TW2 represents the voltage applied to the triple well for the word line switch transistors connected to the selection word lines and dummy word lines (e.g., triple wells 622 and/or 624 of FIG. 9). The signal BLKSEL2 is the selection signal sent to word line switch transistors of the block selected for programming that are connected to selection word lines and dummy word lines. These word line switch transistors are in the second triple well whose voltage is WSW TW2 (e.g., BLKSEL2 is equivalent to Vs2 of FIG. 14). The signal BLKSELn2 is the signal sent to unselected blocks and is connected to the selection input of word line switch transistors that are connected to the dummy word lines or selection word lines (BLKSELn2 is equivalent to Vs4 of FIG. 14). The signal SG_WL is the voltage applied to the selection word lines (SGS and/or SGD). The signal dummy_WL is the voltage applied to the dummy word lines.

Prior to time t0, all of the signals depicted in FIG. 16 are at 0 volts. The signals Memory TW, WSW TW2, and BLKSELn2 are at 0 volts for the entire time period depicted in FIG. 16. At time t0, those bit lines connected to NAND strings that are to be inhibited from programming are set at 3 volts (or another positive voltage that will inhibit programming) and those bit lines that are connected to NAND strings that will be programmed are set at zero volts and remain there until time t4. At time t0, WSW TW1 is raised to 3 volts and remains there until time t4. Thus, the first triple well housing the word line switch transistors connected to data word lines is biased to 3 volts. In prior systems, that triple well remains at zero volts. At time t0 the signal BLKSEL1 is raised to 29 volts, so the maximum voltage difference across the word line switch transistor is 26 volts, which is 3.5 volts lower than previous memory systems. Because the voltage difference is lower, the word line switch transistor can be made smaller. At time t0 the signal BLKSELn1 is set to 3 volts. At time t0, the voltage on the data word lines data_WL, is raised to 3 volts, and then raised again to 7.2 volts and/or 10.2 volts at time t1. At time t2, the voltage on the data word lines is raised based on which data word line. For the selected data word line, at t2 the voltage is raised to the program voltage Vpgm (which can be as high as 23.5 volts). Some non-selected word lines are set at V pass (10.2 volts) while other data word lines are set at Vgp (7.2 volts). At time t0 the signal BLKSEL2 is raised to 15 volts, the signal SGL WL is spiked up at t0 and then comes down to a steady state of 10 volts. At time t1 the dummy word lines dummy_WL are raised to 8 volts. At times t3 and t4, the various signals are lowered to 0 volts.

The process depicted in FIG. 16 represents one iteration of the process of FIG. 7. That is, one iteration through steps 504 to 522 of FIG. 7 correspond to t0-t4. The time period between t2 and t3 corresponds to step 508 of FIG. 7. As can be seen from FIG. 16, the voltage in the triple well housing the word line switch transistors for the data word lines is at 3 volts, which is higher than the voltage (0 volts) for the for the triple well housing the word line switch transistors for the selection word lines and dummy word lines.

When the triple well housing the word line switch transistors connected to the data word lines is at 3 volts between t1 and t3, it is biased such that P well region 710 (see FIG. 13) is biased at 3 volts and corresponding N well region 712 is biased at 0 volts. When the triple well housing the word line switch transistors connected to word lines and dummy word lines is at 0 volts between t1 and t3, both the P well region 710 and N well region 712 are biased at 0 volts.

Figure 17:
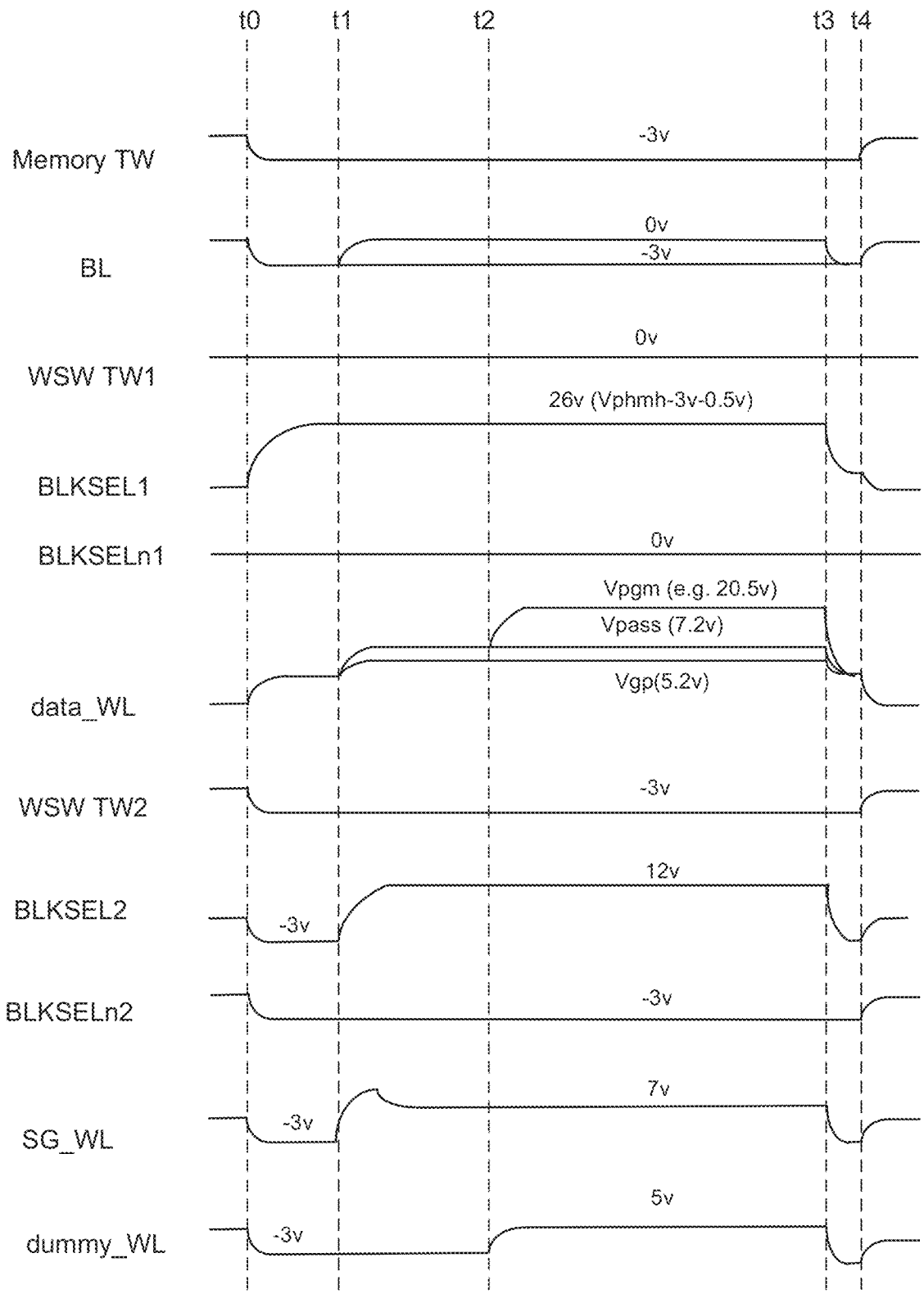
FIG. 17 is a timing diagram describing one embodiment of a process for programming non-volatile memory.

FIG. 17 is a timing diagram describing another embodiment of a process for programming non-volatile memory. The process of FIG. 17 is another example implementation of the process of FIG. 15 and can be performed by the structure of FIG. 14 and/or any of the structures of FIGS. 1-4E. The process of FIG. 17 can implement any of the embodiments of FIGS. 9-12. FIG. 17 shows the same signals as FIG. 16. A difference between the embodiment of FIG. 17 and the embodiment of FIG. 16 is that in the embodiment of FIG. 16 the triple well for word line switch transistors connected to data word lines is at 3 volts and the triple well for word line switch transistors connected to selection word lines is at 0 volts, while in the process of FIG. 17, the triple well for word line switch transistors connected to data word lines is at 0 volts (a non-negative voltage) and the triple well for word line switch transistors connected to selection word lines is at −3 volts. In both cases, the triple well for word line switch transistors connected to data word lines is at a greater voltage than the triple well for word line switch transistors connected to the selection word lines. Prior to time t0, all signals depicted in FIG. 17 are at 0 volts.

At time t0 of FIG. 17, the signal Memory TW (the triple well housing the memory) is lowered from 0 volts to −3 volts and stays there until time t4 when it is raised back to 0 volts. At time t0, the bit line signal BL is lowered to −3 volts for NAND strings that are to receive programming and then raised to 0 volts at time t1 for NAND strings that are to be inhibited from programming. The signal BL returns to 0 volts at time t4. The triple well for word line switch transistors connected to data word lines (WSW TW1) remains at 0 volts the entire time period depicted in FIG. 17. AT time to, the signal BLKSESL1 is raised to 26 volts and stays there until time t3 when is lowered down to 0 volts. The signal BLKSELn1 is at 0 volts for the entire time period depicted in FIG. 17. The data word lines data_WL are raised at time t0 to 3 volts, raised again at time t1 to 5.2 volts for some of the non-selected word lines and 7.2 volts for the other non-selected word lines and the selected word line. At time t2, the selected word line is raised to Vpgm (e.g., up to 20.5 volts). The data word lines data_WL are lowered back down to zero volts starting at time t3.

At time t0, the signal WSW TW2 is lowered to −3 volts so that the triple well housing the word line switch transistors for the selection word lines and dummy word lines is at −3 volts, which is 3 volts lower in magnitude than the triple well for the word line switch transistors connected to data word lines. At time t0 the signal BLKSEL2 is lowered to −3 volts and then raised at time t1 to 12 volts, lowered to −3 volts at time t3 and raised to 0 volts at time t4. The signal BLKSELn2 is lowered to −3 volts at time t0 and raised back to 0 volts at time t4. The signal SG_WL is lowered to −3 volts at time t0, ramps up at time t1 and goes to steady state of 7 volts until time t3 when is lowered down to −3 volts and then raised up to 0 volts at time t4. The signal dummy_WL is lowered to −3 volts at time t0, raised to 5 volts at time t2, lowered to −3 volts at time t3 and then raised to 0 volts at time t4.

When the triple well housing the word line switches connected to the data word lines is at 0 volts between t1 and t3, the triple well is biased such that P well region 710 (see FIG. 13) is at 0 volts and N well region 712 is at −3 volts. The triple well for the word line switches connected to selection word lines and dummy word lines is set at −3 volts between t1 and t3 by biasing the P well region 710 and the N well region 712 for that triple well at −3 volts.

One embodiment includes a non-volatile storage apparatus comprising: a non-volatile memory comprising a plurality of non-volatile memory cells; a plurality of control lines extending across the non-volatile memory; a first plurality of control line switches connected to a first subset of the control lines, the first plurality of control line switches are positioned in a first well; a second plurality of control line switches connected to a second subset of the control lines, the second plurality of control line switches are positioned in a second well; and a control circuit connected to the first plurality of control line switches, the second plurality of control line switches, the first well and the second well. The control circuit is configured to program one or more memory cells connected to a selected control line of the first subset of the control lines by: causing the first well to be at a first voltage, causing the second well to be at a second voltage, the first voltage is higher than the second voltage, applying a first set of programming process signals to the first plurality of control line switches and applying a second set of programming process signals to the second plurality of control line switches, and applying one or more selection signals to the first plurality of control line switches and the second plurality of control line switches to cause the first plurality of control line switches to pass the first set of programming process signals to the first subset of the control lines and cause the second plurality of control line switches to pass the second set of programming process signals to the second subset of the control lines.

In various alternatives, the first well and/or second well can be part of a triple well, part of a double well or a single well.

In one example implementation, the plurality of control lines are a plurality of word lines, the first subset of the control lines is a first subset of the word lines, the second subset of the control lines is a second subset of the word lines; the first plurality of control line switches are a first plurality of word line switch transistors; the second plurality of control line switches are a second plurality of word line switch transistors; the non-volatile memory comprises a set of NAND strings forming a block of non-volatile memory cells; the first subset of the word lines and the second subset of the word lines extend across the block of non-volatile memory cells; the first subset of the word lines are data word lines; the second subset of the word lines include selection word lines; the non-volatile storage apparatus further comprises bit lines and a substrate; each NAND string is connected to one of the bit lines; each NAND string is connected to all of the first subset of the word lines; the first well is a first triple well; and the second well is a second triple well.

One embodiment includes a method for operating non-volatile storage apparatus, comprising: applying one or more selection voltages to a first set of word line switch transistors connected to a first set of word lines that are connected to a first grouping of non-volatile memory cells, the first set of word line switch transistors comprises a first subset of word line switch transistors connected to a first subset of word lines for the first grouping of non-volatile memory cells and a second subset of word line switch transistors connected to a second subset of word lines for the first grouping of non-volatile memory cells, the first subset of word line switch transistors are positioned in a first triple well, the second subset of word line switch transistors are positioned in a second triple well, the one or more selection voltages turn on the first set of word line switch transistors; applying one or more deselect voltages to a second set of word line switch transistors connected to a second set of word lines connected to second grouping of non-volatile memory cells, the one or more deselect voltages turn off the second set of word line switch transistors; causing the first triple well to be at a higher voltage than the second triple well while applying the one or more selection voltages to the first set of word line switch transistors; applying a first set of programming process voltages to the first subset of word line switch transistors while applying the one or more selection voltages to the first set of word line switch transistors in order to pass the first set of programming process voltages to the first subset of word lines; and applying a second set of programming process voltages to the second subset of word line switch transistors while applying the one or more selection voltages to the first set of word line switch transistors in order to pass the second set of programming process voltages to the second subset of word lines, the first set of programming process voltages includes a program voltage that is passed to a selected word line of the first subset of word lines in order to program a memory cell connected to the selected word line.

One embodiment includes a non-volatile storage apparatus, comprising: a substrate; a first triple well in the substrate; a second triple well in the substrate; a non-volatile memory comprising a set of NAND strings forming a block of non-volatile memory cells; a control circuit; a plurality of word lines extending across the block of non-volatile memory cells; a first plurality of word line switch transistors positioned in the first triple well each having a selection terminal connected to the control circuit, an input terminal connected to the control circuit and an output terminal connected to a word line of a first subset of the plurality of word lines; and a second plurality of word line switch transistors positioned in the second triple well each having a selection terminal connected to the control circuit, an input terminal connected to the control circuit and an output terminal connected to a word line of a second subset of the plurality of word lines. The control circuit is configured to program one or more memory cells connected to a selected word line of the first subset of the plurality of word lines by biasing the first triple well at a higher voltage than the second triple well, applying programming process voltages to the input terminals of the first plurality of word line switch transistors and the second plurality of word line switch transistors, and applying one or more selection voltages to the selection terminals of the first plurality of word line switch transistors and the second plurality of word line switch transistors to turn on the first plurality of word line switch transistors and the second plurality of word line switch transistors such that the first plurality of word line switch transistors and the second plurality of word line switch transistors pass respective programming process voltages to respective connected word lines.

One example implementation further includes a memory triple well, the block of non-volatile memory cells are positioned in the memory triple well, the control circuit is configured to bias the memory triple well to a lower voltage than the first triple well when programming the one or more memory cells connected to the selected word line of the first subset of the plurality of word lines.

One example implementation further includes a third triple well in the substrate; a fourth triple well in the substrate; a third plurality of word line switch transistors positioned in the third triple well each having a selection terminal connected to the control circuit, an input terminal connected to the control circuit and an output terminal connected to a word line of a third subset of the plurality of word lines; and a fourth plurality of word line switch transistors positioned in the fourth triple well each having a selection terminal connected to the control circuit, an input terminal connected to the control circuit and an output terminal connected to a word line of a fourth subset of the plurality of word lines; when programming the one or more memory cells connected to the selected word line of the first subset of the plurality of word lines. The control circuit is configured to: bias the third triple well to a voltage higher than the second triple well, bias the fourth triple well at a lower voltage than the first triple well, apply programming process voltages to the input terminals of the third plurality of word line switch transistors and the fourth plurality of word line switch transistors, and apply one or more selection voltages to the selection terminals of the third plurality of word line switch transistors and the fourth plurality of word line switch transistors to turn on the third plurality of word line switch transistors and the fourth plurality of word line switch transistors.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
    a non-volatile memory comprising a plurality of non-volatile memory cells;
    a plurality of control lines extending across the non-volatile memory;
    a first plurality of control line switches connected to a first subset of the control lines, the first plurality of control line switches are positioned in a first well;
    a second plurality of control line switches connected to a second subset of the control lines, the second plurality of control line switches are positioned in a second well; and
    a control circuit connected to the first plurality of control line switches, the second plurality of control line switches, the first well and the second well;
    the control circuit is configured to program one or more memory cells connected to a selected control line of the first subset of the control lines by:
        causing the first well to be at a first voltage,
        causing the second well to be at a second voltage, the first voltage is higher than the second voltage, applying a first set of programming process signals to the first plurality of control line switches and applying a second set of programming process signals to the second plurality of control line switches, and applying one or more selection signals to the first plurality of control line switches and the second plurality of control line switches to cause the first plurality of control line switches to pass the first set of programming process signals to the first subset of the control lines and cause the second plurality of control line switches to pass the second set of programming process signals to the second subset of the control lines.

2. The non-volatile storage apparatus of claim 1, wherein:
the plurality of control lines are a plurality of word lines, the first subset of the control lines is a first subset of the word lines, the second subset of the control lines is a second subset of the word lines;
the first plurality of control line switches are a first plurality of word line switch transistors;
the second plurality of control line switches are a second plurality of word line switch transistors;
the non-volatile storage apparatus further comprises bit lines and a substrate;
the first well is a first triple well in the substrate; and
the second well is a second triple well in the substrate.

3. The non-volatile storage apparatus of claim 1, wherein:
the control circuit is configured to cause the first well to be at the first voltage and cause the second well to be at the second voltage by biasing the first well to a positive voltage and biasing the second well to ground.

4. The non-volatile storage apparatus of claim 1, wherein:
the control circuit is configured to cause the first well to be at the first voltage and cause the second well to be at the second voltage by biasing the second well to a negative voltage and biasing the first well to a non-negative voltage.

5. The non-volatile storage apparatus of claim 1, further comprising:
a third plurality of control line switches connected to a third subset of the control lines, the third plurality of control line switches are positioned in a third well, the control circuit is configured to cause the third well to be at a third voltage during the programming of the one or more memory cells connected to the selected control line of the first subset of the control lines, the third voltage is different than at least one of the first voltage and the second voltage.

6. The non-volatile storage apparatus of claim 1, further comprising:
additional pluralities of control line switches connected to additional subsets of the control lines, the additional pluralities of control line switches are positioned in additional wells, the non-volatile memory comprises a block of non-volatile memory cells, the additional subsets of the control lines are connected to the block of non-volatile memory cells, the first subset of the control lines are connected to the block of non-volatile memory cells, the second subset of the control lines are connected to the block of non-volatile memory cells.

7. The non-volatile storage apparatus of claim 1, further comprising:
a third plurality of control line switches connected to a third subset of the control lines, the third plurality of control line switches are positioned in a third well; and
a fourth plurality of control line switches connected to a fourth subset of the control lines, the fourth plurality of control line switches are positioned in a fourth well, the non-volatile memory includes a plane, the first well and the second well are on a first side of the plane, the third well and the fourth well are on a second side of the planer.

8. The non-volatile storage apparatus of claim 7, wherein:
the control circuit is configured to cause the third well to be at the first voltage and the fourth to be at the second voltage during the programming of the one or more memory cells connected to the selected control line of the first subset of the control lines.

9. The non-volatile storage apparatus of claim 1, further comprising:
a memory triple well, the non-volatile memory is positioned in the memory triple well, the first well is a first triple well, the second well is a second triple well, the control circuit is configured to cause the memory triple well to be at a third voltage, the first voltage is higher than the third voltage.

10. The non-volatile storage apparatus of claim 1, further comprising:
a memory triple well, the non-volatile memory is positioned in the memory triple well, the first well is a first triple well, the second well is a second triple well, the control circuit is configured to cause the memory triple well to be at the second voltage, the non-volatile memory comprises a block of non-volatile memory cells, the first subset of the control lines include data word lines that are connected to the block of non-volatile memory cells, the second subset of the control lines include selection word lines that are connected to the block of non-volatile memory cells.

11. The non-volatile storage apparatus of claim 1, wherein:
the plurality of control lines is a plurality of word lines;
the first subset of the control lines is a first subset of word lines;
the second subset of the control lines is a second subset of word lines;
each control line switch of the first plurality of control line switches has a selection terminal connected to the control circuit, an input terminal connected to the control circuit and an output terminal connected to a word line of a first subset of word lines;
each control line switch of the second plurality of control line switches has a selection terminal connected to the control circuit, an input terminal connected to the control circuit and an output terminal connected to a word line of a second subset of word lines; and
the control circuit is configured to apply the one or more selection signals to the selection terminals of the first plurality of control line switches and selection terminals of the second plurality of control line switches, the first selection voltage is higher than the second selection voltage.

12. The non-volatile storage apparatus of claim 11, wherein:
the control circuit is configured to perform the applying the one or more selection signals to the first plurality of control line switches and the second plurality of control line switches by applying a first selection voltage to the selection terminal of the first plurality of control line switches and a second selection voltage to the selection terminal of the second plurality of control line switches, the first selection voltage is higher than the second selection voltage.

13. The non-volatile storage apparatus of claim 1, wherein:
- the plurality of control lines are a plurality of word lines, the first subset of the control lines is a first subset of the word lines, the second subset of the control lines is a second subset of the word lines;
- the first plurality of control line switches are a first plurality of word line switch transistors;
- the second plurality of control line switches are a second plurality of word line switch transistors;
- the non-volatile memory comprises a set of NAND strings forming a block of non-volatile memory cells;
- the first subset of the word lines and the second subset of the word lines extend across the block of non-volatile memory cells;
- the first subset of the word lines are data word lines;
- the second subset of the word lines include selection word lines;
- the non-volatile storage apparatus further comprises bit lines and a substrate;
- each NAND string is connected to one of the bit lines;
- each NAND string is connected to all of the first subset of the word lines;
- the first well is a first triple well; and
- the second well is a second triple well.

14. The non-volatile storage apparatus of claim 1, further comprising:
- a first semiconductor die; and
- a second semiconductor die bonded to the first semiconductor die, the non-volatile memory is positioned on the first semiconductor die, the control circuit is positioned on the second semiconductor die, the non-volatile memory is a three dimensional memory structure.

15. A method for operating non-volatile storage apparatus, comprising:
- applying one or more selection voltages to a first set of word line switch transistors connected to a first set of word lines that are connected to a first grouping of non-volatile memory cells, the first set of word line switch transistors comprises a first subset of word line switch transistors connected to a first subset of word lines for the first grouping of non-volatile memory cells and a second subset of word line switch transistors connected to a second subset of word lines for the first grouping of non-volatile memory cells, the first subset of word line switch transistors are positioned in a first triple well, the second subset of word line switch transistors are positioned in a second triple well, the one or more selection voltages turn on the first set of word line switch transistors;
- applying one or more deselect voltages to a second set of word line switch transistors connected to a second set of word lines connected to second grouping of non-volatile memory cells, the one or more deselect voltages turn off the second set of word line switch transistors;
- causing the first triple well to be at a higher voltage than the second triple well while applying the one or more selection voltages to the first set of word line switch transistors;
- applying a first set of programming process voltages to the first subset of word line switch transistors while applying the one or more selection voltages to the first set of word line switch transistors in order to pass the first set of programming process voltages to the first subset of word lines; and
- applying a second set of programming process voltages to the second subset of word line switch transistors while applying the one or more selection voltages to the first set of word line switch transistors in order to pass the second set of programming process voltages to the second subset of word lines, the first set of programming process voltages includes a program voltage that is passed to a selected word line of the first subset of word lines in order to program a memory cell connected to the selected word line.

16. The method of claim 15, further comprising:
- causing a memory triple well to be at a lower voltage than the first triple well while applying the one or more selection voltages to the first set of word line switch transistors, the first grouping of non-volatile memory cells are positioned in the memory triple well.

17. The method of claim 15, wherein:
- the first grouping is a first block of non-volatile memory cells;
- the second grouping is a second block of non-volatile memory cells;
- the first subset of word lines comprises data word lines; and
- the second subset of word lines comprises selection word lines.

18. A non-volatile storage apparatus, comprising:
- a substrate;
- a first triple well in the substrate;
- a second triple well in the substrate;
- a non-volatile memory comprising a set of NAND strings forming a block of non-volatile memory cells;
- a control circuit;
- a plurality of word lines extending across the block of non-volatile memory cells;
- a first plurality of word line switch transistors positioned in the first triple well each having a selection terminal connected to the control circuit, an input terminal connected to the control circuit and an output terminal connected to a word line of a first subset of the plurality of word lines; and
- a second plurality of word line switch transistors positioned in the second triple well each having a selection terminal connected to the control circuit, an input terminal connected to the control circuit and an output terminal connected to a word line of a second subset of the plurality of word lines;
- the control circuit is configured to program one or more memory cells connected to a selected word line of the first subset of the plurality of word lines by biasing the first triple well at a higher voltage than the second triple well, applying programming process voltages to the input terminals of the first plurality of word line switch transistors and the second plurality of word line switch transistors, and applying one or more selection voltages to the selection terminals of the first plurality of word line switch transistors and the second plurality of word line switch transistors to turn on the first plurality of word line switch transistors and the second plurality of word line switch transistors such that the first plurality of word line switch transistors and the second plurality of word line switch transistors pass respective programming process voltages to respective connected word lines.

19. The non-volatile storage apparatus of claim 18, further comprising:
- a memory triple well, the block of non-volatile memory cells are positioned in the memory triple well, the control circuit is configured to bias the memory triple well to a lower voltage than the first triple well when programming the one or more memory cells connected to the selected word line of the first subset of the plurality of word lines.

20. The non-volatile storage apparatus of claim 19, further comprising:
a third triple well in the substrate;
a fourth triple well in the substrate;
a third plurality of word line switch transistors positioned in the third triple well each having a selection terminal connected to the control circuit, an input terminal connected to the control circuit and an output terminal connected to a word line of a third subset of the plurality of word lines; and
a fourth plurality of word line switch transistors positioned in the fourth triple well each having a selection terminal connected to the control circuit, an input terminal connected to the control circuit and an output terminal connected to a word line of a fourth subset of the plurality of word lines;
when programming the one or more memory cells connected to the selected word line of the first subset of the plurality of word lines, the control circuit is configured to:
bias the third triple well to a voltage higher than the second triple well,
bias the fourth triple well at a lower voltage than the first triple well,
apply programming process voltages to the input terminals of the third plurality of word line switch transistors and the fourth plurality of word line switch transistors, and
apply one or more selection voltages to the selection terminals of the third plurality of word line switch transistors and the fourth plurality of word line switch transistors to turn on the third plurality of word line switch transistors and the fourth plurality of word line switch transistors.

* * * * *